US012727491B2

(12) United States Patent
Tsao et al.

(10) Patent No.: US 12,727,491 B2
(45) Date of Patent: Sep. 1, 2026

(54) INTEGRATED CIRCUIT PACKAGES AND METHODS OF FORMING THE SAME

(71) Applicant: Taiwan Semiconductor Manufacturing Co., Ltd., Hsinchu (TW)

(72) Inventors: Wei-An Tsao, Yuanlin Township (TW); Chen Yu Wu, Taoyuan City (TW); Po-Han Wang, Hsinchu (TW); Yu-Hsiang Hu, Hsinchu (TW); Hung-Jui Kuo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 403 days.

(21) Appl. No.: 18/365,756

(22) Filed: Aug. 4, 2023

(65) Prior Publication Data

US 2024/0379565 A1 Nov. 14, 2024

Related U.S. Application Data

(60) Provisional application No. 63/501,458, filed on May 11, 2023.

(51) Int. Cl.
*H10W 70/60* (2026.01)
*H10W 70/05* (2026.01)
(Continued)

(52) U.S. Cl.
CPC .......... *H10W 70/611* (2026.01); *H10W 70/05* (2026.01); *H10W 70/685* (2026.01);
(Continued)

(58) Field of Classification Search
CPC .. H10W 70/611; H10W 70/05; H10W 70/685
See application file for complete search history.

(56) References Cited

U.S. PATENT DOCUMENTS 6,566,735 B1 * 5/2003 Minn .................... H10W 76/48 257/209
8,426,961 B2 4/2013 Shih et al.
(Continued)

FOREIGN PATENT DOCUMENTS

KR 20000043557 A 7/2000
KR 20190053780 A 5/2019
(Continued)

*Primary Examiner* — Errol V Fernandes
(74) *Attorney, Agent, or Firm* — Slater Matsil, LLP

(57) ABSTRACT

Embodiments include a method for forming an integrated circuit package. A first dielectric layer is deposited over a wafer, the first dielectric layer overlapping a package region and a scribe line region of the wafer. A first metallization pattern is formed extending along and through the first dielectric layer. A second dielectric layer is deposited over the first metallization pattern and the first dielectric layer, the second dielectric layer overlapping the package region and the scribe line region. The second dielectric layer is removed from the scribe line region, the second dielectric layer remaining in the package region. After the second dielectric layer is removed from the scribe line region, a second metallization pattern is formed extending along and through the second dielectric layer. The wafer and the first dielectric layer are sawed in the scribe line region.

20 Claims, 23 Drawing Sheets

(51) Int. Cl.

| | |
|---|---|
| ***H10W 70/685*** | (2026.01) |
| ***H10W 74/01*** | (2026.01) |
| ***H10W 74/10*** | (2026.01) |
| ***H10W 90/00*** | (2026.01) |
| *H10W 72/00* | (2026.01) |
| *H10W 74/15* | (2026.01) |

(52) U.S. Cl.

CPC ........ *H10W 74/014* (2026.01); *H10W 74/117* (2026.01); *H10W 90/00* (2026.01); *H10W 90/401* (2026.01); *H10W 72/0198* (2026.01); *H10W 72/072* (2026.01); *H10W 72/073* (2026.01); *H10W 74/15* (2026.01); *H10W 90/724* (2026.01); *H10W 90/734* (2026.01)

(56) References Cited

U.S. PATENT DOCUMENTS

| | | | | |
|---|---|---|---|---|
| 9,000,584 | B2 | 4/2015 | Lin et al. | |
| 9,048,222 | B2 | 6/2015 | Hung et al. | |
| 9,048,233 | B2 | 6/2015 | Wu et al. | |
| 9,064,879 | B2 | 6/2015 | Hung et al. | |
| 9,111,949 | B2 | 8/2015 | Yu et al. | |
| 9,263,511 | B2 | 2/2016 | Yu et al. | |
| 9,281,254 | B2 | 3/2016 | Yu et al. | |
| 9,368,460 | B2 | 6/2016 | Yu et al. | |
| 9,372,206 | B2 | 6/2016 | Wu et al. | |
| 9,490,190 | B2 | 11/2016 | Lin et al. | |
| 9,496,189 | B2 | 11/2016 | Yu et al. | |
| 11,101,140 | B2 | 8/2021 | Wei et al. | |
| 11,264,359 | B2 | 3/2022 | Hsu et al. | |
| 11,450,615 | B2 | 9/2022 | Tsai et al. | |
| 2008/0128904 | A1* | 6/2008 | Sakamoto ........... | H10W 74/147 257/737 |
| 2014/0027928 | A1 | 1/2014 | Watanabe et al. | |
| 2019/0006354 | A1* | 1/2019 | Wu ........................ | H10D 88/00 |

FOREIGN PATENT DOCUMENTS

| | | | |
|---|---|---|---|
| TW | 201201351 | A | 1/2012 |
| TW | 201413891 | A | 4/2014 |
| TW | 202147538 | A | 12/2021 |
| TW | 202209600 | A | 3/2022 |

* cited by examiner 60B
58
52
52
52
52
52
52
56
56
56
56
56
50F
62
54

INTEGRATED CIRCUIT PACKAGES AND METHODS OF FORMING THE SAME

PRIORITY CLAIM AND CROSS-REFERENCE

This application claims the benefit of U.S. Provisional Application No. 63/501,458, filed on May 11, 2023, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
FIG. 1 is a cross-sectional view of an integrated circuit die.
Figure 1:
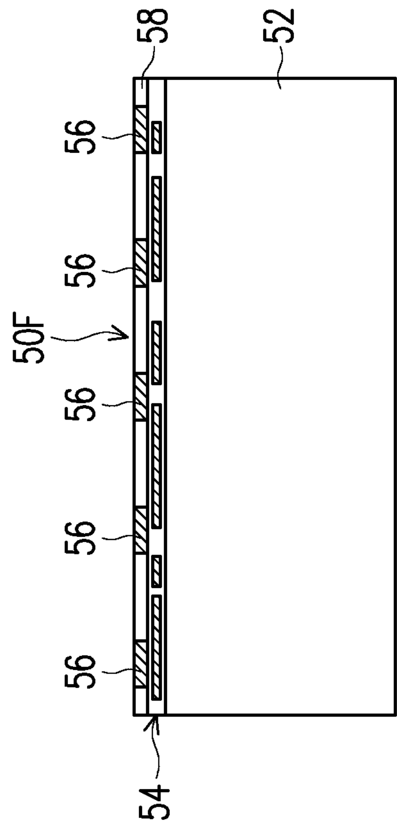

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, dielectric layers for a redistribution structure are formed over a wafer. The wafer includes interposers. A lower subset of the dielectric layers is formed in a scribe line region between the interposers, while an upper subset of the dielectric layers are removed from the scribe line region. The wafer and the lower subset of the dielectric layers are sawed in the scribe line region to singulate the interposers. Forming only the lower subset of the dielectric layers of the redistribution structure in the scribe line region may help reduce delamination during the sawing while increasing step coverage of the upper subset of the dielectric layers.

FIG. 1 is a cross-sectional view of an integrated circuit die 50. Multiple integrated circuit dies 50 will be packaged in subsequent processing to form integrated circuit packages. Each integrated circuit die 50 may be a logic die (e.g., central processing unit (CPU), graphics processing unit (GPU), system-on-a-chip (SoC) die, microcontroller, etc.), a memory die (e.g., dynamic random access memory (DRAM) die, static random access memory (SRAM) die, etc.), a power management die (e.g., power management integrated circuit (PMIC) die), a radio frequency (RF) die, an interface die, a sensor die, a micro-electro-mechanical-system (MEMS) die, a signal processing die (e.g., digital signal processing (DSP) die), a front-end die (e.g., analog front-end (AFE) dies), the like, or combinations thereof. The integrated circuit die 50 may be formed in a wafer, which may include different die regions that are singulated in subsequent steps to form a plurality of integrated circuit dies 50. The integrated circuit die 50 includes a semiconductor substrate 52, an interconnect structure 54, die connectors 56, and a dielectric layer 58.

The semiconductor substrate 52 may be a substrate of silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active surface (e.g., the surface facing upward in FIG. 1) and an inactive surface (e.g., the surface facing downward in FIG. 1). Devices are at the active surface of the semiconductor substrate 52. The devices may be active devices (e.g., transistors, diodes, etc.), capacitors, resistors, etc. The inactive surface may be free from devices.

The interconnect structure 54 is over the active surface of the semiconductor substrate 52, and is used to electrically connect the devices of the semiconductor substrate 52 to form an integrated circuit. The interconnect structure 54 may include one or more dielectric layer(s) and respective metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer, such as polybenzoxazole (PBO), polyimide, a benzocyclobuten (BCB) based polymer, or the like. The metallization layer(s) may include conductive vias and/or conductive lines to interconnect the devices of the semiconductor substrate 52. The metallization layer(s) may be formed of a conductive material, such as a metal, such as copper, cobalt, aluminum, gold, combinations thereof, or the like. The metallization layer(s) of the interconnect structure 54 may be formed by a damascene process, such as a single damascene process, a dual damascene process, or the like.

Die connectors 56 are at the front side 50F of the integrated circuit die 50. The die connectors 56 may be conductive pillars, pads, or the like, to which external connections are made. The die connectors 56 are in and/or on the interconnect structure 54. For example, the die connectors 56 may be part of an upper metallization layer of the interconnect structure 54. The die connectors 56 can be formed of a metal, such as copper, aluminum, or the like, and can be formed by, for example, plating, or the like.

Optionally, solder regions (not separately illustrated) may be disposed on the die connectors 56 during formation of the integrated circuit die 50. The solder regions may be used to perform chip probe (CP) testing on the integrated circuit die 50. For example, the solder regions may be solder balls, solder bumps, or the like, which are used to attach a chip probe to the die connectors 56. Chip probe testing may be performed on the integrated circuit die 50 to ascertain whether the integrated circuit die 50 is a known good die (KGD). Thus, only integrated circuit dies 50, which are KGDs, undergo subsequent processing are packaged, and dies which fail the chip probe testing are not packaged. After testing, the solder regions may be removed.

A dielectric layer 58 is at the front side 50F of the integrated circuit die 50. The dielectric layer 58 is in and/or on the interconnect structure 54. For example, the dielectric layer 58 may be an upper dielectric layer of the interconnect structure 54. The dielectric layer 58 laterally encapsulates the die connectors 56. The dielectric layer 58 may be an oxide, a nitride, a carbide, a polymer, the like, or a combination thereof. The dielectric layer 58 may be formed, for example, by spin coating, lamination, chemical vapor deposition (CVD), or the like. Initially, the dielectric layer 58 may bury the die connectors 56, such that the top surface of the dielectric layer 58 is above the top surfaces of the die connectors 56. The die connectors 56 may be exposed through the dielectric layer 58. Exposing the die connectors 56 may remove any solder regions that may be present on the die connectors 56. A removal process can be applied to the various layers to remove excess materials over the die connectors 56. The removal process may be a planarization process such as a chemical mechanical polish (CMP), an etch-back, combinations thereof, or the like. After the planarization process, top surfaces of the die connectors 56 and the dielectric layer 58 are coplanar (within process variations) and are exposed at the front side 50F of the integrated circuit die 50.

Figure 2A:
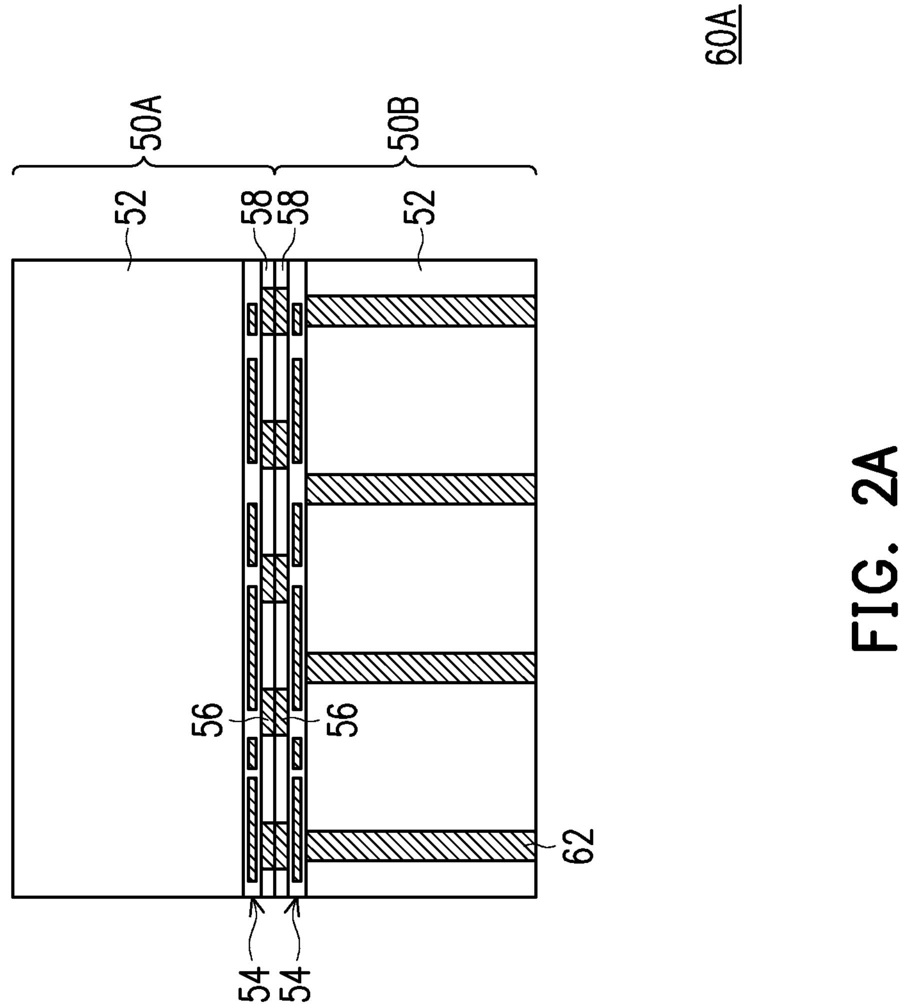
FIGS. 2A-2B are cross-sectional views of die stacks.
Figure 2B:
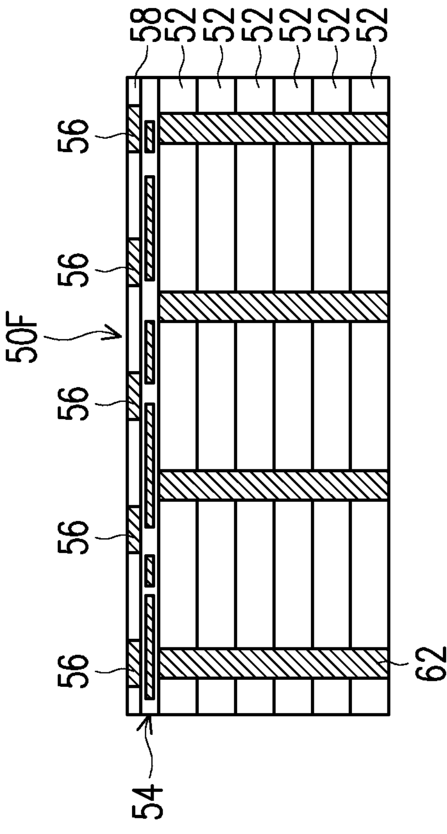

FIGS. 2A-2B are cross-sectional views of die stacks 60A, 60B, respectively. The die stacks 60A, 60B may each have a single function (e.g., a logic device, memory die, etc.), or may have multiple functions. In some embodiments, the die stack 60A is a logic device such as a system-on-integrated-chip (SoIC) device and the die stack 60B is a memory device such as high bandwidth memory (HBM) device.

As shown in FIG. 2A, the die stack 60A includes two bonded integrated circuit dies 50 (e.g., a first integrated circuit die 50A and a second integrated circuit die 50B). In some embodiments, the first integrated circuit die 50A is a logic die, and the second integrated circuit die 50B is an interface die. The interface die bridges the logic die to memory dies, and translates commands between the logic die and the memory dies. In some embodiments, the first integrated circuit die 50A and the second integrated circuit die 50B are bonded such that the active surfaces are facing each other (e.g., are "face-to-face" bonded). Conductive vias 62 may be formed through one of the integrated circuit dies 50 so that external connections may be made to the die stack 60A. The conductive vias 62 may be through-substrate vias (TSVs), such as through-silicon vias or the like. In the embodiment shown, the conductive vias 62 are formed in the second integrated circuit die 50B (e.g., the interface die). The conductive vias 62 extend through the semiconductor substrate 52 of the respective integrated circuit die 50, to be physically and electrically connected to the metallization layer(s) of the interconnect structure 54.

As shown in FIG. 2B, the die stack 60B is a stacked device that includes multiple semiconductor substrates 52. For example, the die stack 60B may be a memory device that includes multiple memory dies such as a hybrid memory cube (HMC) device, a high bandwidth memory (HBM) device, or the like. Each of the semiconductor substrates 52 may (or may not) have a separate interconnect structure 54. The semiconductor substrates 52 are connected by conductive vias 62, such as TSVs.

FIGS. 3-19 are views of intermediate stages in the manufacturing of an integrated circuit package 200, in accordance with some embodiments. The resulting integrated circuit package 200 is shown in FIG. 19. Package components 100 are formed by bonding integrated circuit devices 120 (see FIG. 4) to a wafer 110. The wafer 110 has package regions 110P, which include devices, such as interposers 170. The wafer 110 also has a scribe line region 110S that separates the package regions 110P. The package regions 110P will be singulated in subsequent processing by cutting in the scribe line region 110S to form the package components 100, each of which includes a singulated portion of the wafer 110 (e.g., an interposer 170) and the integrated circuit devices 120 which are bonded to that singulated portion of the wafer 110. In an embodiment, the package components 100 are chip-on-wafer (CoW) components, although it should be appreciated that embodiments may be applied to other three-dimensional integrated circuit (3DIC) packages. A package component 100 is then mounted to a package substrate 180. In an embodiment, the integrated circuit package 200 is a chip-on-wafer-on-substrate (CoWoS®) package, although it should be appreciated that embodiments may be applied to other 3DIC packages.

Figure 3:
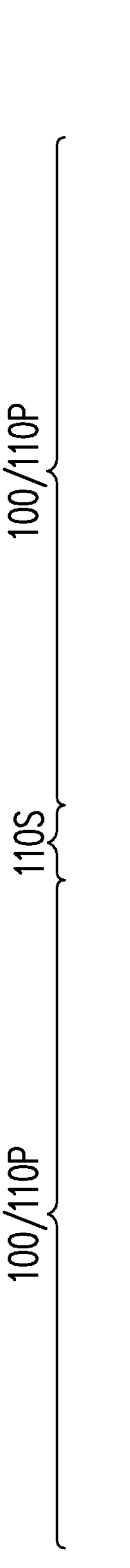
FIGS. 3-19 are views of intermediate stages in the manufacturing of an integrated circuit package, in accordance with some embodiments.
Figure 3:
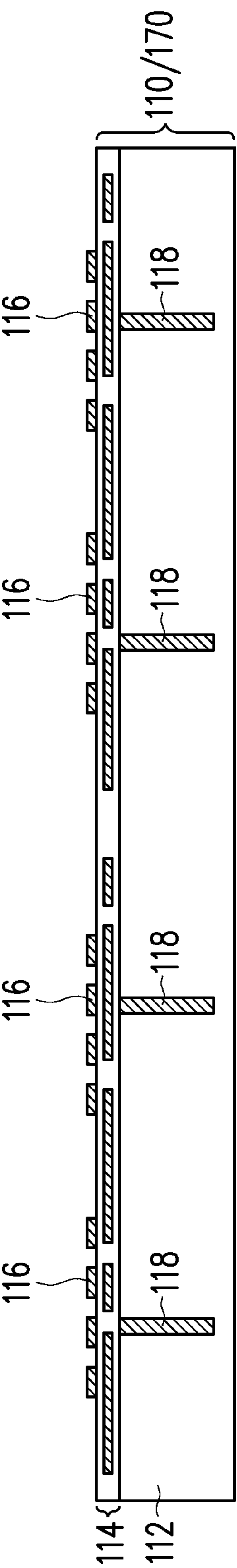

In FIG. 3, a wafer 110 is obtained or formed. The wafer 110 includes devices in the package regions 110P, which will be singulated in subsequent processing to be included in the package components 100. The devices in the wafer 110 may be interposers, integrated circuits dies, or the like. In some embodiments, interposers 170 are formed in the wafer 110, where the interposers 170 include a substrate 112, an interconnect structure 114, die connectors 116, and conductive vias 118.

The substrate 112 may be a bulk semiconductor substrate, a semiconductor-on-insulator (SOI) substrate, a multi-layered semiconductor substrate, or the like. The substrate 112 may include a semiconductor material, such as silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The substrate 112 may be doped or undoped. In embodiments where interposers are formed in the wafer 110, the substrate 112 generally does not include active devices therein, although the interposers may include passive devices formed in and/or on a front surface (e.g., the surface facing upward in FIG. 3) of the substrate 112. In embodiments where integrated circuits devices are formed in the wafer 110, active devices such as transistors, capacitors, resistors, diodes, and the like, may be formed in and/or on the front surface of the substrate 112.

The interconnect structure 114 is over the front surface of the substrate 112, and is used to electrically connect the devices (if any) of the substrate 112. The interconnect structure 114 may include one or more dielectric layer(s) and respective metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization layer(s) may include conductive vias and/or conductive lines to interconnect any devices together and/or to an external device. The metallization layer(s) may be formed of a conductive material, such as a metal, such as copper, cobalt, aluminum, gold, combinations thereof, or the like. The metallization layer(s) of the interconnect structure 114 may be formed by a damascene process, such as a single damascene process, a dual damascene process, or the like. The metallization layer(s) are formed in the package regions 110P, while the scribe line region 110S may be free of metallization layer(s).

Die connectors 116 are at the front side of the wafer 110. The die connectors 116 may be conductive pillars, pads, or the like, to which external connections are made. The die connectors 116 are in and/or on the interconnect structure 114. The die connectors 116 can be formed of a metal, such as copper, aluminum, or the like, and can be formed by, for example, plating, or the like. The die connectors 116 are formed in the package regions 110P, while the scribe line region 110S may be free of die connectors.

The conductive vias 118 extend into the interconnect structure 114 and/or the substrate 112. The conductive vias 118 are electrically connected to metallization layer(s) of the interconnect structure 114. The conductive vias 118 may be TSVs. As an example to form the conductive vias 118, recesses can be formed in the interconnect structure 114 and/or the substrate 112 by, for example, etching, milling, laser techniques, a combination thereof, or the like. A thin barrier layer may be conformally deposited in the openings, such as by CVD, atomic layer deposition (ALD), physical vapor deposition (PVD), thermal oxidation, a combination thereof, or the like. The barrier layer may be formed of an oxide, a nitride, a carbide, combinations thereof, or the like. A conductive material may be deposited over the barrier layer and in the openings. The conductive material may be formed by an electro-chemical plating process, CVD, ALD, PVD, a combination thereof, or the like. Examples of conductive materials are copper, tungsten, aluminum, silver, gold, a combination thereof, or the like. Excess conductive material and barrier layer is removed from a surface of the interconnect structure 114 or the substrate 112 by, for example, a CMP. Remaining portions of the barrier layer and conductive material form the conductive vias 118. The conductive vias 118 are formed in the package regions 110P, while the scribe line region 110S may be free of conductive vias.

Figure 4:
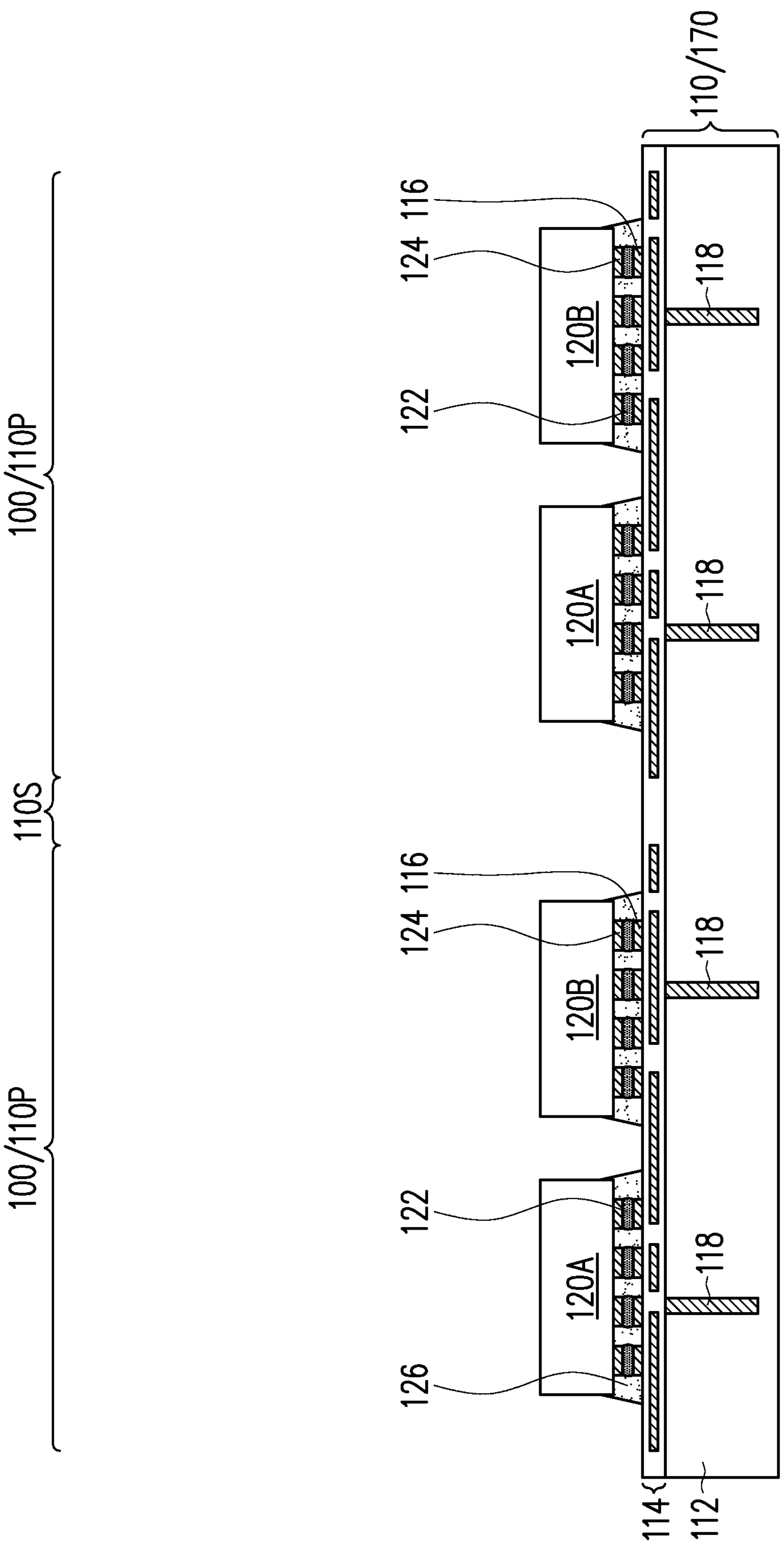

In FIG. 4, integrated circuit devices 120 are attached to the front side of the wafer 110. Multiple integrated circuit devices 120 are placed adjacent one another in each package region 110P. The integrated circuit devices 120 in each package region 110P include a logic device 120A and a memory device 120B. The logic devices 120A and the memory devices 120B may be formed in processes of a same technology node, or may be formed in processes of different technology nodes. For example, the logic devices 120A may be formed by a more advanced process node than the memory devices 120B. The integrated circuit devices 120 are attached in the package regions 110P, while the scribe line region 110S may be free of integrated circuit devices.

Each logic device 120A may be a central processing unit (CPU), graphics processing unit (GPU), system-on-a-chip (SoC), microcontroller, or the like. The logic devices 120A may be integrated circuit dies (similar to the integrated circuit die 50 described for FIG. 1) or may be a die stacks (similar to the die stack 60A described for FIG. 2A). In some embodiments, the logic devices 120A are integrated circuit dies such as system-on-chip (SoC) dies, such that the resulting integrated circuit package is a CoWoS-Standard (CoWoS-S) package. In some embodiments, the logic devices 120A are die stacks such as system-on-integrated-chip (SoIC) devices, such that the resulting integrated circuit package is a CoWoS-Active-on-Active (CoWoS-AoA) package.

Each memory device 120B may be a dynamic random access memory (DRAM) die, static random access memory (SRAM) die, hybrid memory cube (HMC) module, a high bandwidth memory (HBM) module, or the like. The memory devices 120B may be integrated circuit dies (similar to the integrated circuit die 50 described for FIG. 1) or may be die stacks (similar to the die stack 60B described for FIG. 2B). In some embodiments, the memory devices 120B are die stacks, such as high bandwidth memory (HBM) devices.

In the illustrated embodiment, the integrated circuit devices 120 are attached to the wafer 110 with solder bonds, such as with conductive connectors 122. Die connectors 124 are at the front sides of the integrated circuit devices 120. The integrated circuit devices 120 may be placed on the interconnect structure 114 using, e.g., a pick-and-place tool. The conductive connectors 122 may be formed of a conductive material that is reflowable, such as solder, copper, aluminum, gold, nickel, silver, palladium, tin, the like, or a combination thereof. In some embodiments, the conductive connectors 122 are formed by initially forming a layer of solder through methods such as evaporation, electroplating, printing, solder transfer, ball placement, or the like. Once a layer of solder has been formed on the structure, a reflow may be performed in order to shape the conductive connectors 122 into desired bump shapes. Attaching the integrated circuit devices 120 to the wafer 110 may include placing the integrated circuit devices 120 on the wafer 110 and reflowing the conductive connectors 122. The conductive connectors 122 form joints between the die connectors 124 of the integrated circuit devices 120 and the die connectors 116 of the wafer 110, thereby electrically connecting the interposers 170 to the integrated circuit devices 120.

An underfill 126 may be formed around the conductive connectors 122, and between the wafer 110 and the integrated circuit devices 120. The underfill 126 may reduce stress and protect the joints resulting from the reflowing of the conductive connectors 122. The underfill 126 may be formed of an underfill material such as a molding compound, epoxy, or the like. The underfill 126 may be formed by a capillary flow process after the integrated circuit devices 120 are attached to the wafer 110, or may be formed by a suitable deposition method before the integrated circuit devices 120 are attached to the wafer 110. The underfill 126 may be applied in liquid or semi-liquid form and then subsequently cured.

In other embodiments (not separately illustrated), the integrated circuit devices 120 are attached to the wafer 110 with direct bonds. For example, fusion bonding, dielectric bonding, metal bonding, combinations thereof (e.g., a combination of dielectric-to-dielectric bonding and metal-to-metal bonding), or the like may be used to directly bond corresponding dielectric layers and/or die connectors of the wafer 110 and the integrated circuit devices 120 without the use of adhesive or solder. The underfill 126 may be omitted when direct bonding is used. Further, a mix of bonding techniques could be used, e.g., some integrated circuit devices 120 could be attached to the wafer 110 by solder bonds, and other integrated circuit devices 120 could be attached to the wafer 110 by direct bonds.

Figure 5:
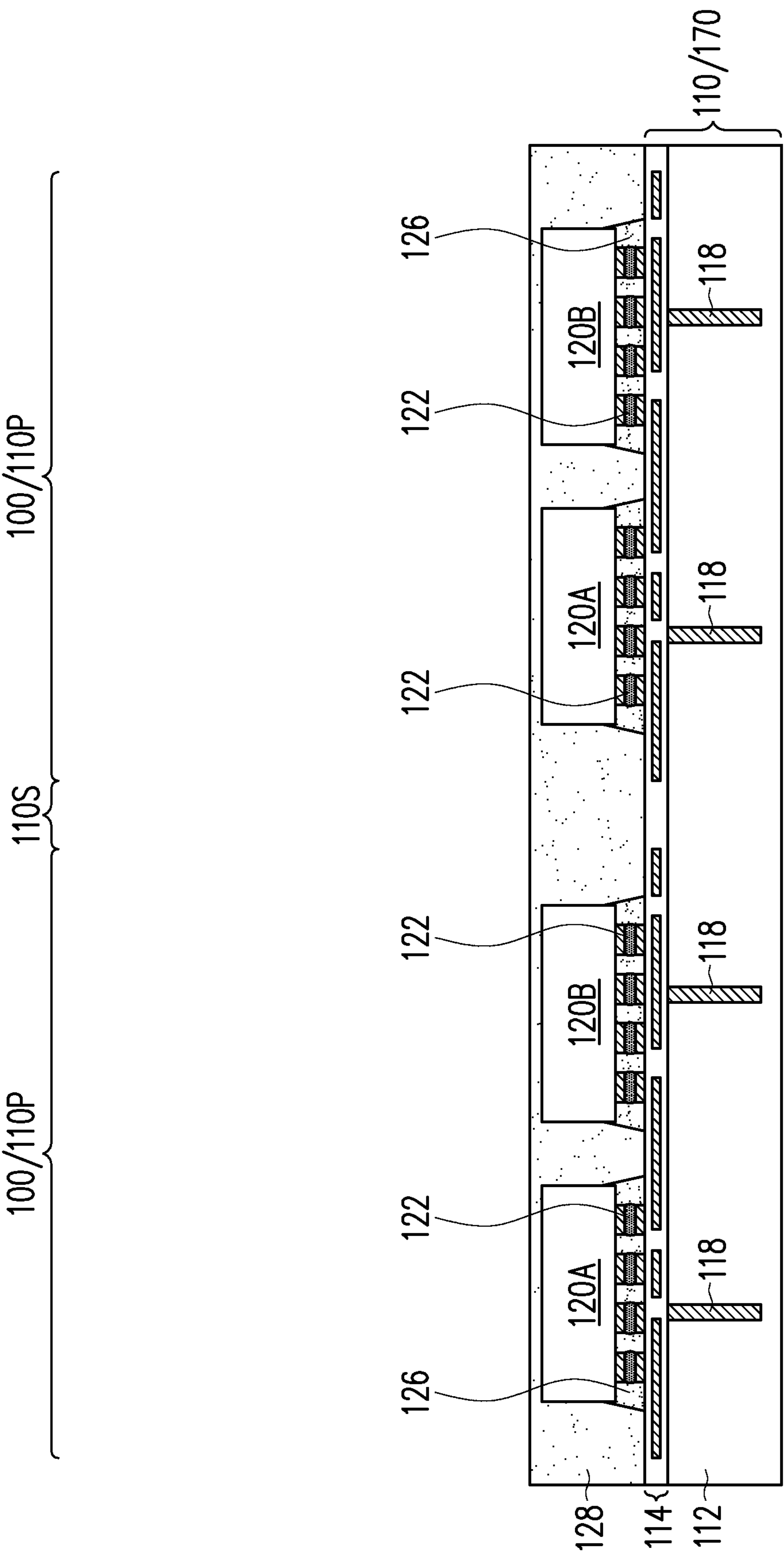

In FIG. 5, an encapsulant 128 is formed on and around the various components. After formation, the encapsulant 128 encapsulates the underfill 126 (if present) and the integrated circuit devices 120. The encapsulant 128 may be a molding compound, epoxy, or the like. The encapsulant 128 may be applied by compression molding, transfer molding, or the like, and is formed over the wafer 110 such that the integrated circuit devices 120 are buried or covered. The encapsulant 128 is further formed in gap regions between the integrated circuit devices 120. The encapsulant 128 may be applied in liquid or semi-liquid form and then subsequently cured.

Optionally, the encapsulant 128 may be thinned (not separately illustrated) to expose the integrated circuit devices 120. The thinning process may be a grinding process, a chemical-mechanical polish (CMP), an etch-back, combinations thereof, or the like. After the thinning process, the top surfaces of the integrated circuit devices 120 and the encapsulant 128 are substantially coplanar (within process variations). The thinning is performed until a desired amount of the integrated circuit devices 120 and the encapsulant 128 has been removed.

Figure 6:
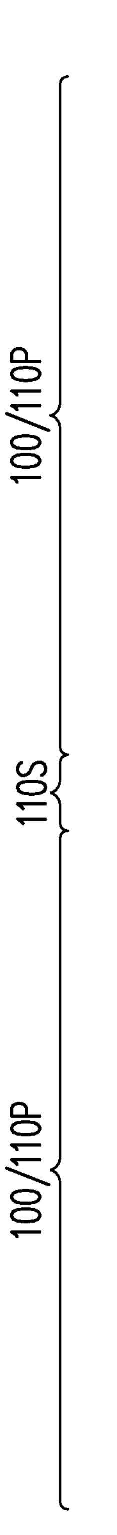
Figure 6:
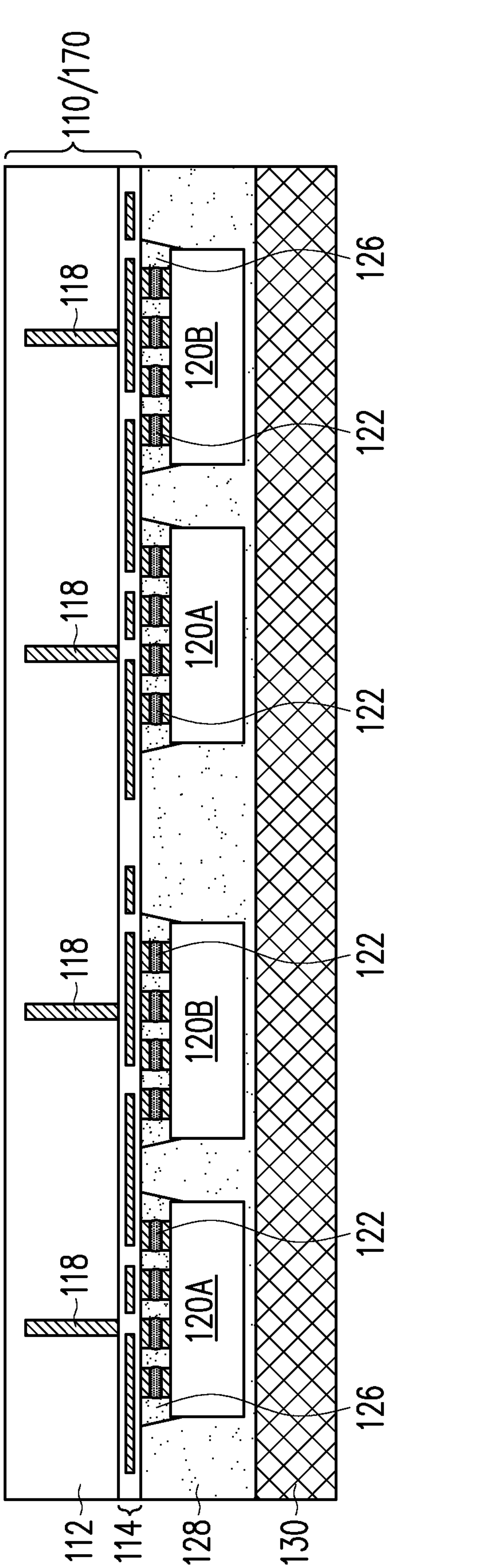

In FIG. 6, the intermediate structure is flipped over to prepare for processing of the back side of the wafer 110. The intermediate structure may be placed on a carrier substrate 130 or other suitable support structure for subsequent processing. In some embodiments, the carrier substrate 130 is a substrate such as a bulk semiconductor or a glass substrate. The carrier substrate 130 may be attached to the encapsulant 128 and/or the integrated circuit devices 120. The carrier substrate 130 may be attached by a bonding layer (not separately illustrated), which may be removed along with the carrier substrate 130 from the structure after processing. In some embodiments, the bonding layer includes an oxide layer such as a layer of silicon oxide. In some embodiments, the bonding layer includes an adhesive, such as a suitable epoxy or the like.

Figure 7:
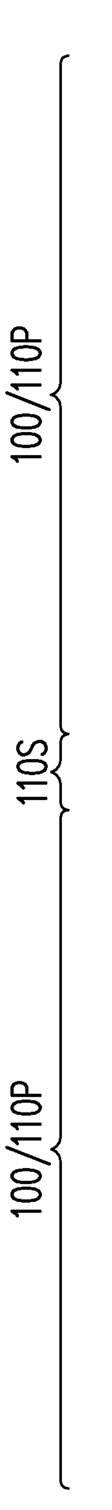
Figure 7:
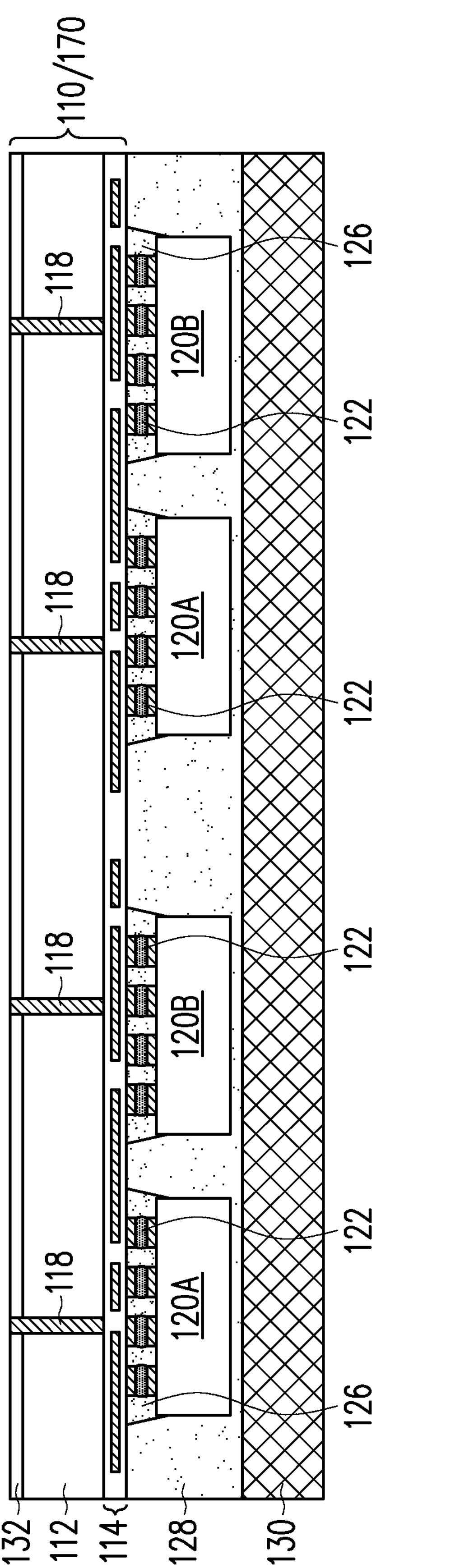

In FIG. 7, the substrate 112 is thinned to expose the conductive vias 118. Exposure of the conductive vias 118 may be accomplished by a thinning process, such as a grinding process, a chemical-mechanical polish (CMP), an etch-back, combinations thereof, or the like. In the illustrated embodiment, a recessing process is performed to recess the back surface of the substrate 112 such that the conductive vias 118 protrude at the back side of the wafer 110. The recessing process may be, e.g., a suitable etch-back process, chemical-mechanical polish (CMP), or the like. In some embodiments, the thinning process for exposing the conductive vias 118 includes a CMP, and the conductive vias 118 protrude at the back side of the wafer 110 as a result of dishing that occurs during the CMP. An insulating layer 132 is optionally formed on the back surface of the substrate 112, surrounding the protruding portions of the conductive vias 118. In some embodiments, the insulating layer 132 is formed of a dielectric material, such as silicon nitride, silicon oxide, silicon oxynitride, or the like, which may be formed by a suitable deposition method such as CVD or the like. Initially, the insulating layer 132 may bury the conductive vias 118. A removal process can be applied to the various layers to remove excess materials over the conductive vias 118. The removal process may be a planarization process such as a chemical mechanical polish (CMP), an etch-back, combinations thereof, or the like. After planarization, the exposed surfaces of the conductive vias 118 and the insulating layer 132 are substantially coplanar (within process variations) and are exposed at the back side of the wafer 110. In another embodiment, the insulating layer 132 is omitted, and the exposed surfaces of the substrate 112 and the conductive vias 118 are substantially coplanar (within process variations).

As subsequently described in greater detail, a redistribution structure 140 (see FIG. 16) will be formed on the back side of the wafer 110. The redistribution structure 140 includes dielectric layers 142, 148, 154; metallization patterns 146, 152; and under bump metallizations (UBMs) 158. Some of the metallization patterns may also be referred to as redistribution layers or redistribution lines. The dielectric layer 142 will be formed in both the package regions 110P and the scribe line region 110S. Meanwhile, the remaining dielectric layers 148, 154 (other than the dielectric layer 142) will be patterned to remove the dielectric layers 148, 154 from the scribe line region 110S, so that they only remain in the package regions 110P. Additionally, a seal ring will be formed in the dielectric layer 142 but not the remaining dielectric layers 148, 154. Subsequently, the redistribution structure 140 will be singulated by cutting in the scribe line region 110S. Forming only a subset of the dielectric layers in the scribe line region 110S and forming seal rings in only that subset of the dielectric layers may help reduce delamination during cutting (as compared to forming all of the dielectric layers in the scribe line region 110S) while increasing step coverage of the dielectric layers (as compared to forming none of the dielectric layers in the scribe line region 110S).

Figure 8:
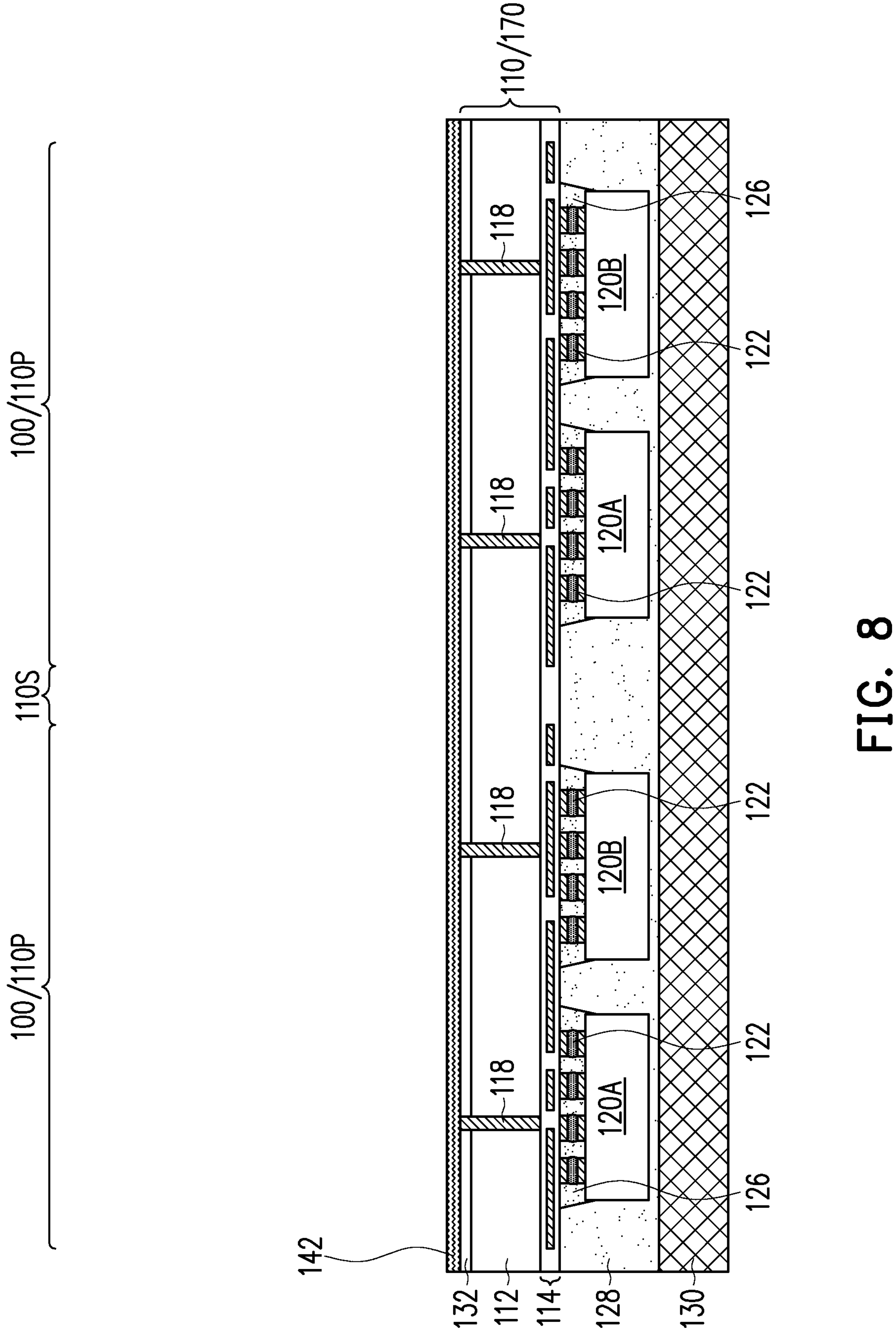

In FIG. 8, a dielectric layer 142 is deposited over the wafer 110 (e.g., on the insulating layer 132). In some embodiments, the dielectric layer 142 is formed of a photosensitive material such as PBO, polyimide, a BCB-based polymer, or the like, which may be subsequently patterned using a lithography mask. The dielectric layer 142 may be formed by spin coating, lamination, CVD, the like, or a combination thereof, and then subsequently cured. The dielectric layer 142, when deposited, overlaps both the scribe line region 110S and the package regions 110P.

Figure 9:
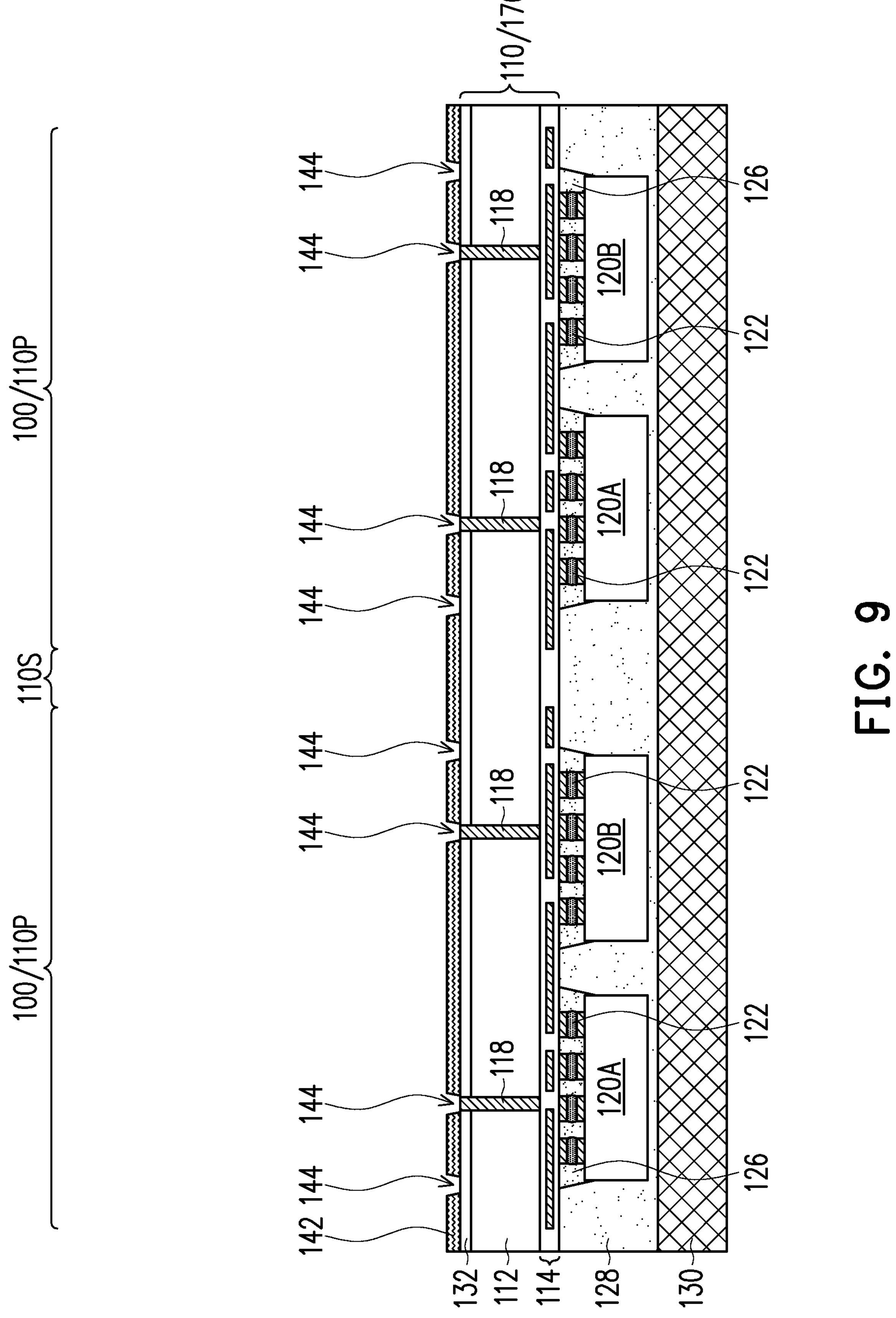

In FIG. 9, the dielectric layer 142 is patterned. The patterning forms openings 144. Some of the openings 144 expose portions of the conductive vias 118, and others of the openings 144 expose the insulating layer 132. The patterning may be by an acceptable process, such as by exposing and developing the dielectric layer 142 to light when the dielectric layer 142 is a photosensitive material or by etching using, for example, an anisotropic etch.

Figure 10:
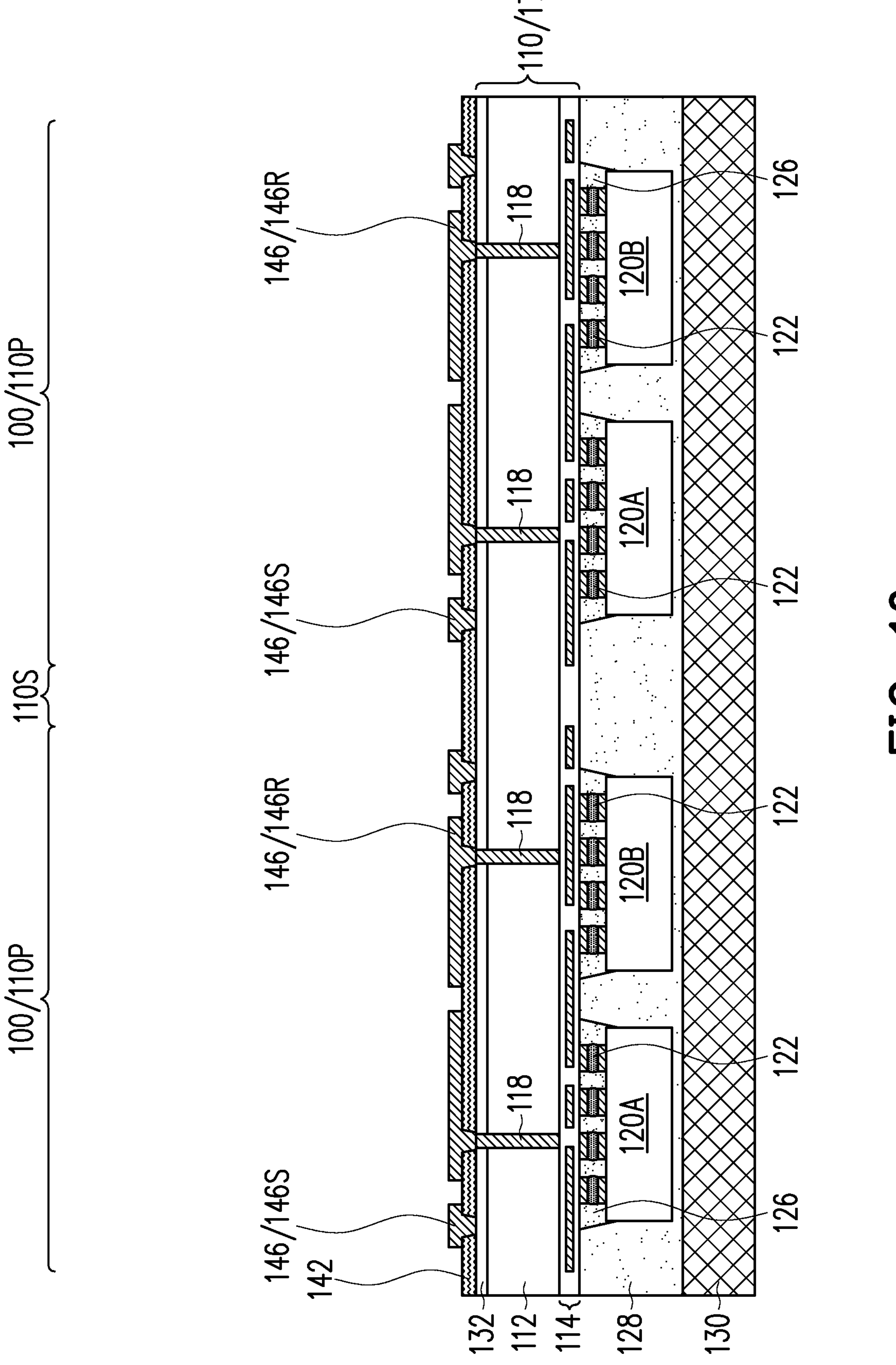

In FIG. 10, a metallization pattern 146 is formed in each package region 110P. The metallization patterns 146 include conductive elements extending along the major surface of the dielectric layer 142 and extending through the dielectric layer 142 to contact the conductive vias 118. As an example to form the metallization patterns 146, a seed layer is formed over the dielectric layer 142 and in the openings 144 extending through the dielectric layer 142. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then deposited and patterned on the seed layer. The photoresist may be deposited by spin coating or the like and may be exposed to light for patterning. The pattern of the photoresist corresponds to the metallization patterns 146. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, like copper, titanium, tungsten, aluminum, or the like. The combination of the conductive material and underlying portions of the seed layer form the metallization patterns 146. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The metallization pattern 146 in each package region 110P includes redistribution lines 146R (which are electrically functional portions of the metallization pattern 146) and a seal ring 146S (which are dummy portions of the metallization pattern 146). The redistribution lines 146R contact the conductive vias 118. The seal ring 146S is electrically isolated from the redistribution lines 146R. The seal ring 146S contacts a surface of the wafer 110 (e.g., the insulating layer 132), but may not contact any of the conductive vias 118. In a top-down view (not separately illustrated), the seal ring 146S in a package region 110P extends around the redistribution lines 146R in that package region 110P. Cutting will be subsequently performed in the scribe line region 110S. The seal rings 146S of adjacent package regions 110P are disposed at opposite sides of the scribe line region 110S. The seal ring 146S physically separates the redistribution lines 146R from the scribe line region 110S, and can stop cut-induced cracks from spreading through the dielectric layer 142.

Figure 11:
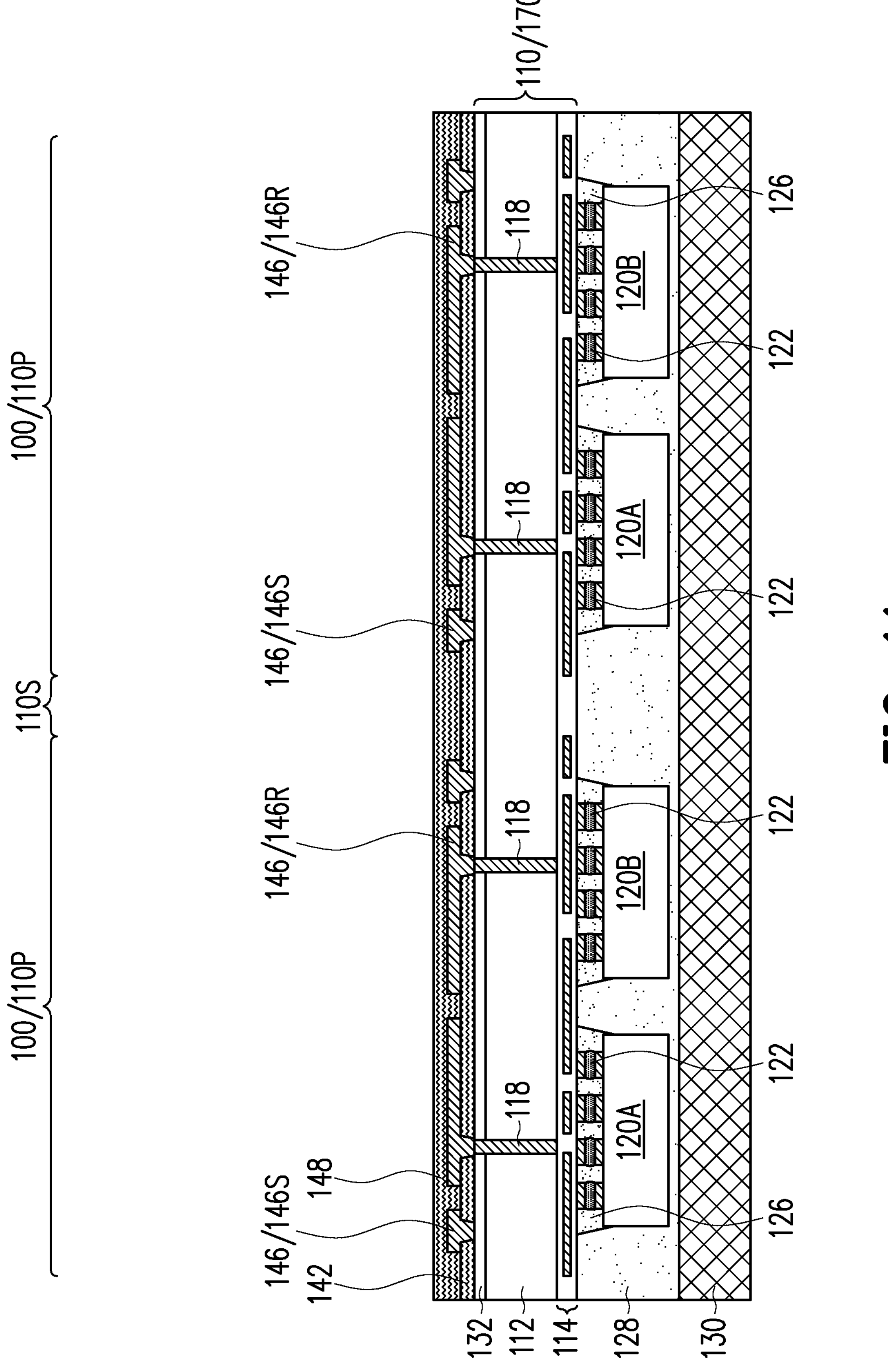

In FIG. 11, a dielectric layer 148 is deposited on the metallization patterns 146 and the dielectric layer 142. In some embodiments, the dielectric layer 148 is formed of a photosensitive material such as PBO, polyimide, a BCB-based polymer, or the like, which may be subsequently patterned using a lithography mask. The dielectric layer 148 may be formed by spin coating, lamination, CVD, the like, or a combination thereof, and then subsequently cured. The dielectric layer 148 may be formed of a similar material as the dielectric layer 142. The dielectric layer 148, when deposited, overlaps both the scribe line region 110S and the package regions 110P.

Figure 12:
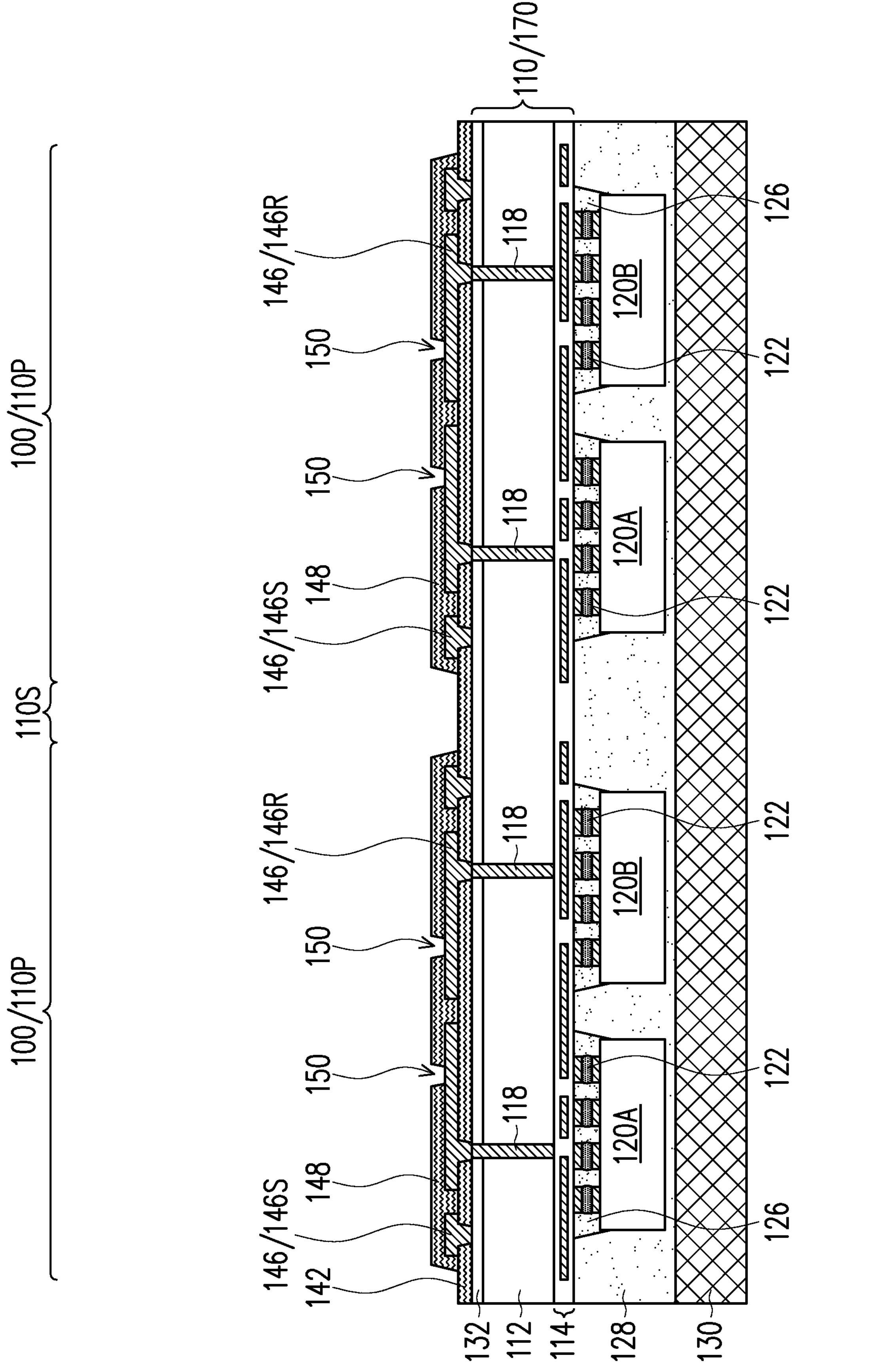

In FIG. 12, the dielectric layer 148 is patterned. The patterning forms openings 150. The openings 150 expose portions of the redistribution lines 146R. The patterning may be by an acceptable process, such as by exposing and developing the dielectric layer 148 to light when the dielectric layer 148 is a photosensitive material or by etching using, for example, an anisotropic etch.

Patterning the dielectric layer 148 also removes the portions of the dielectric layer 148 in the scribe line region 110S. Removing the dielectric layer 148 from the scribe line region 110S separates it into multiple dielectric layers 148, which are the portions remaining in the corresponding package regions 110P. The dielectric layers 148, when patterned, overlap the package regions 110P but not the scribe line region 110S. Thus, each dielectric layer 148 is over a metallization pattern 146 (including the redistribution lines 146R and the seal ring 146S) in a package region 110P. Further, each dielectric layer 148 covers an underlying portion of the dielectric layer 142, but the portion of the dielectric layer 142 in the scribe line region 110S is uncovered by the dielectric layers 148.

Figure 13:
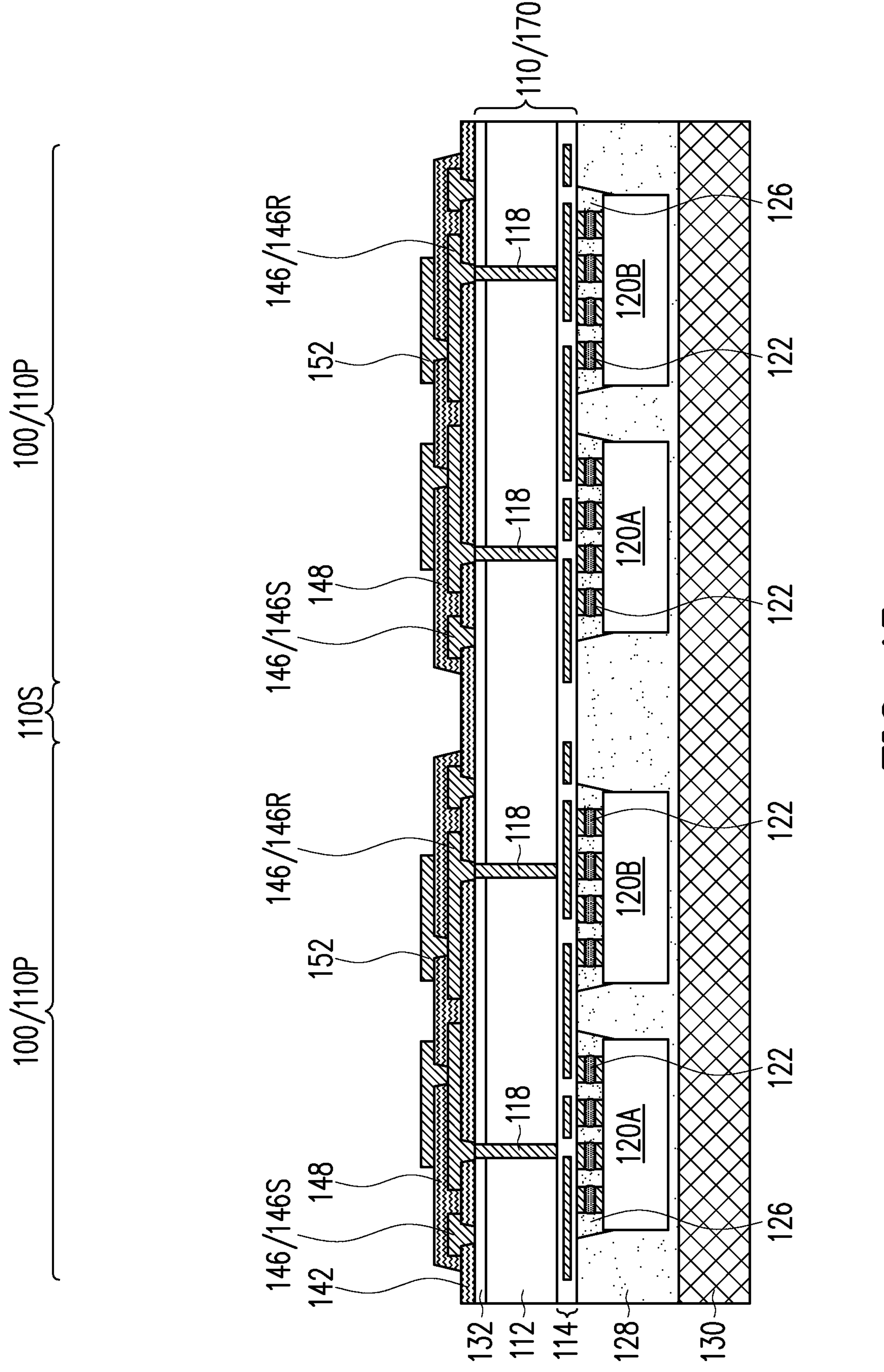

In FIG. 13, a metallization pattern 152 is formed in each package region 110P. The metallization patterns 152 include conductive elements extending along the major surfaces of the dielectric layers 148 and extending through the dielectric layers 148 to contact the redistribution lines 146R. In this embodiment, the metallization patterns 152 include redistribution lines but do not include seal rings. The seal rings 146S remain covered by the dielectric layers 148 and are not contacted by the metallization patterns 152. The dielectric layers 148 extend continuously across the respective top surfaces of the seal rings 146S. As an example to form the metallization patterns 152, a seed layer is formed over the dielectric layers 148 and in the openings 150 extending through the dielectric layers 148. The seed layer is also formed over the portion of the dielectric layer 142 in the scribe line region 110S. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then deposited and patterned on the seed layer. The photoresist may be deposited by spin coating or the like and may be exposed to light for patterning. The pattern of the photoresist corresponds to the metallization patterns 152. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, like copper, titanium, tungsten, aluminum, or the like. The combination of the conductive material and underlying portions of the seed layer form the metallization patterns 152. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 14:
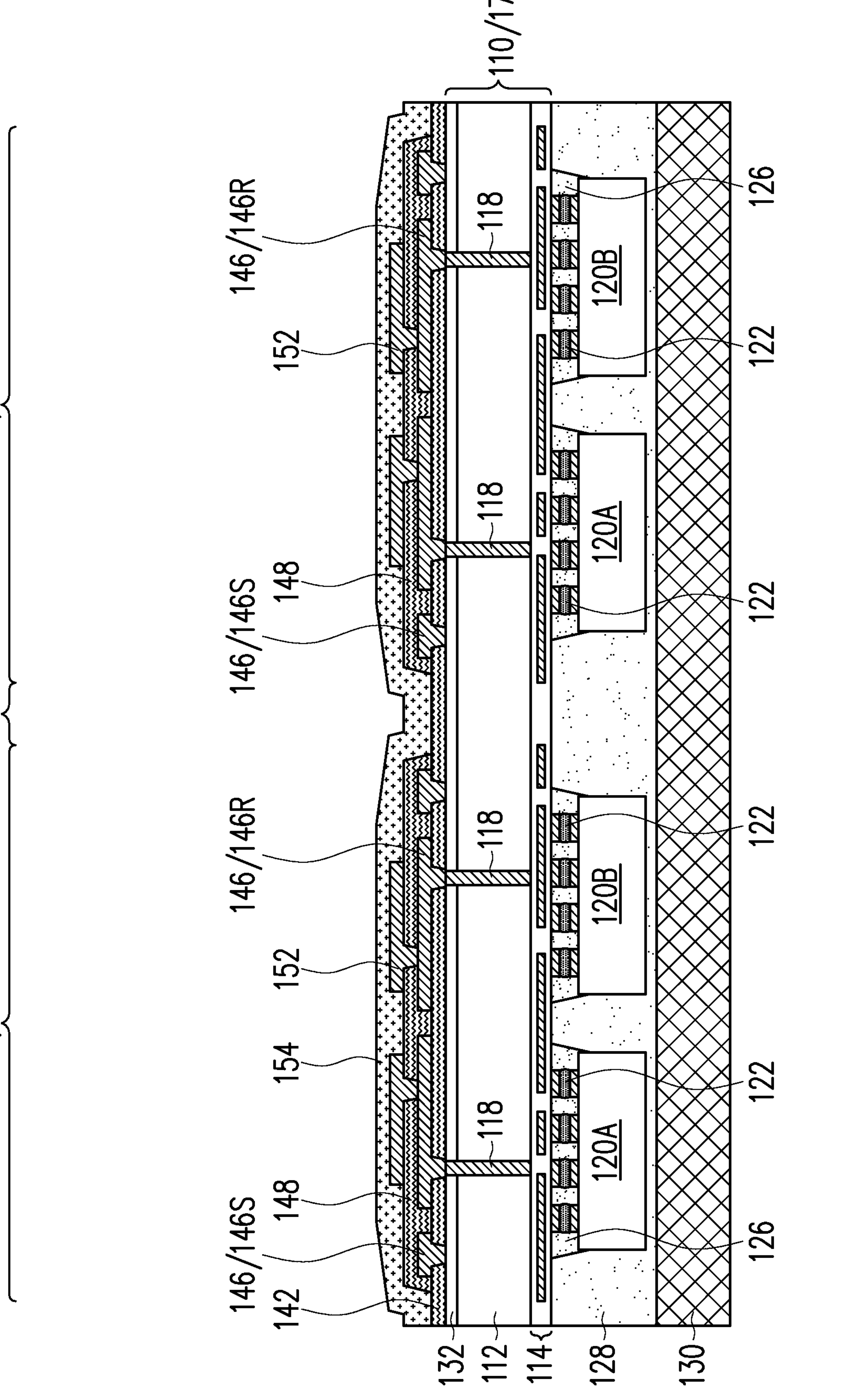

In FIG. 14, a dielectric layer 154 is deposited on the metallization patterns 152 and the dielectric layers 148. The dielectric layer 154 is also deposited on the portion of the dielectric layer 142 in the scribe line region 110S. In some embodiments, the dielectric layer 154 is formed of a photosensitive material such as PBO, polyimide, a BCB-based polymer, or the like, which may be subsequently patterned using a lithography mask. The dielectric layer 154 may be formed by spin coating, lamination, CVD, the like, or a combination thereof, and then subsequently cured. The dielectric layer 154 may be formed of a similar material as the dielectric layers 148 and/or the dielectric layer 142. The dielectric layer 154, when deposited, overlaps both the scribe line region 110S and the package regions 110P.

Figure 15:
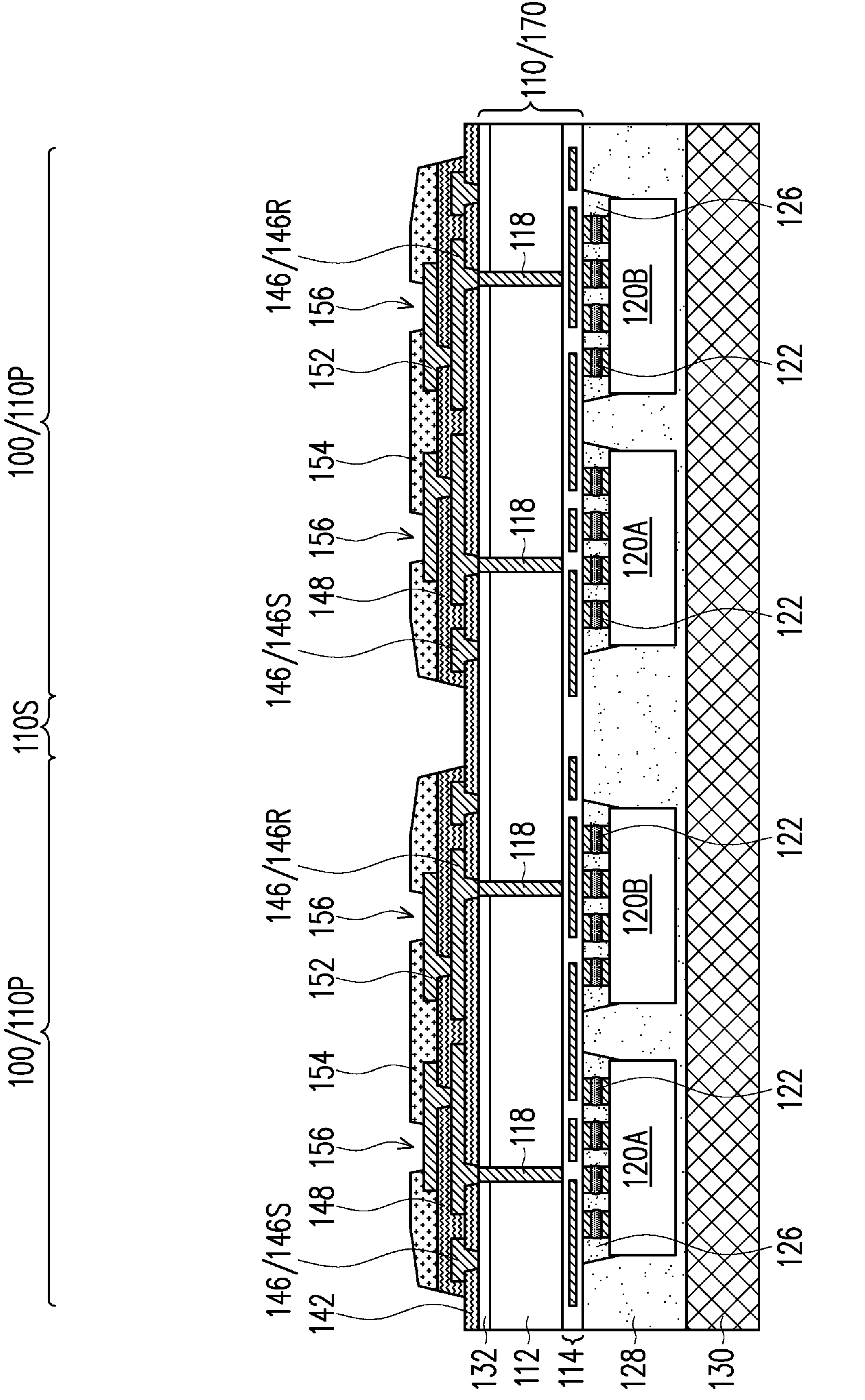

In FIG. 15, the dielectric layer 154 is patterned. The patterning forms openings 156. The openings 156 expose portions of the metallization patterns 152. The patterning may be by an acceptable process, such as by exposing and developing the dielectric layer 154 to light when the dielectric layer 154 is a photosensitive material or by etching using, for example, an anisotropic etch.

Patterning the dielectric layer 154 also removes the portions of the dielectric layer 154 in the scribe line region 110S. Removing the dielectric layer 154 from the scribe line region 110S separates it into multiple dielectric layers 154, which are the portions remaining in the corresponding package regions 110P. The dielectric layers 154, when patterned, overlap the package regions 110P but not the scribe line region 110S. Thus, each dielectric layer 154 is over a metallization pattern 152 in a package region 110P. Further, each dielectric layer 154 covers an underlying dielectric layer 148, but the portion of the dielectric layer 142 in the scribe line region 110S is uncovered by the dielectric layers 154.

Figure 16:
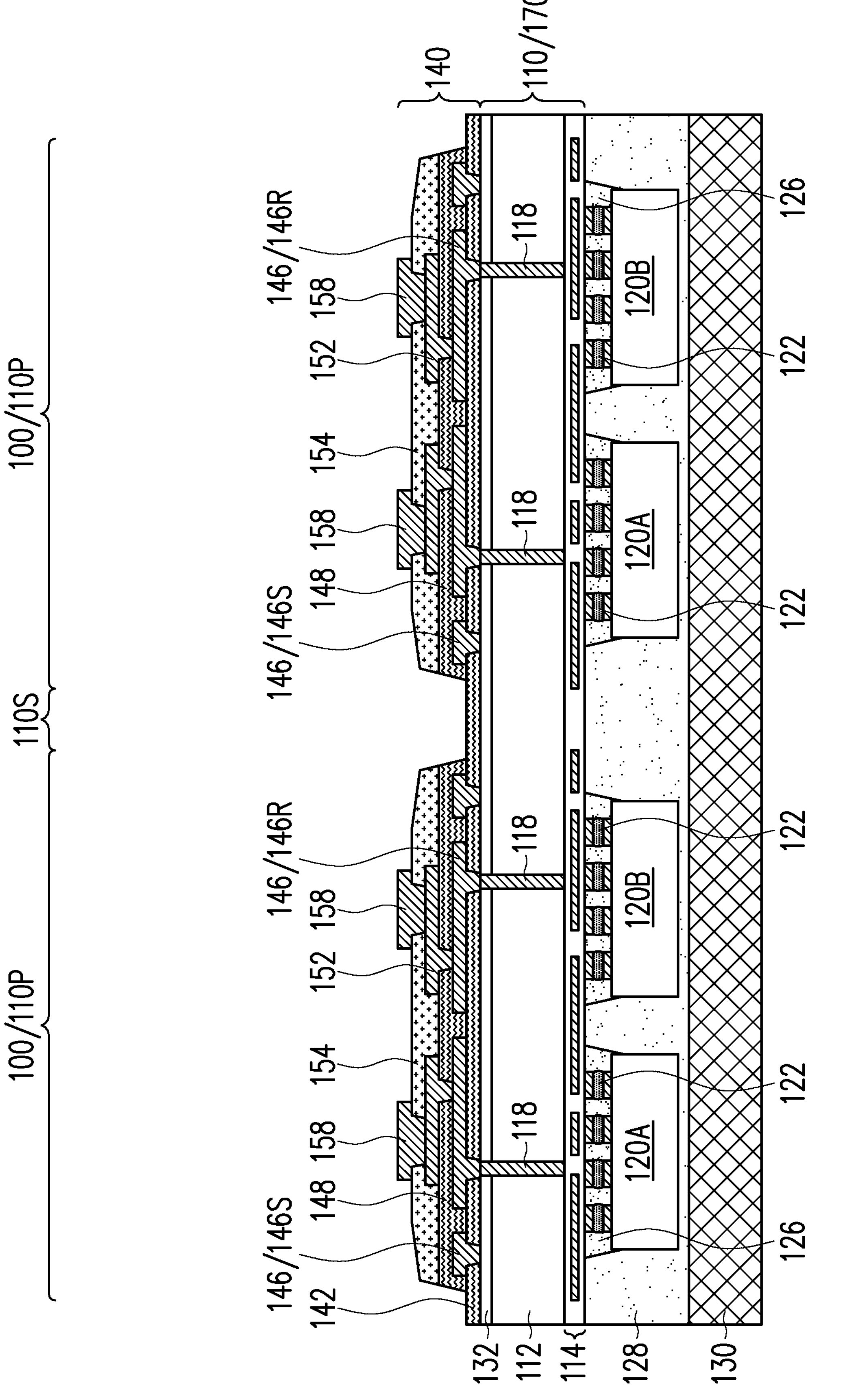

In FIG. 16, UBMs 158 are formed for external connection to the redistribution structure 140. The UBMs 158 have bump portions extending along the major surfaces of the dielectric layers 154 and have via portions extending through the dielectric layers 154 to contact the metallization patterns 152. As an example to form the UBMs 158, a seed layer is formed over the dielectric layers 154 and in the openings 156 extending through the dielectric layers 154. The seed layer is also formed over the portion of the dielectric layer 142 in the scribe line region 110S. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then deposited and patterned on the seed layer. The photoresist may be deposited by spin coating or the like and may be exposed to light for patterning. The pattern of the photoresist corresponds to the UBMs 158. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, like copper, titanium, tungsten, aluminum, or the like. The combination of the conductive material and underlying portions of the seed layer form the UBMs 158. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. In some embodiments, the UBMs 158 have a different (e.g., larger) size than the metallization patterns 146, 152.

The redistribution structure 140 is shown as an example. In this embodiment, the redistribution structure 140 includes three dielectric layers and two layers of metallization patterns, of which one lower dielectric layer (e.g., the dielectric layer 142) remains in the scribe line region 110S and one layer of metallization patterns includes seal rings (e.g., the seal rings 146S). The quantity of dielectric layers in the scribe line region 110S is less than the total quantity of dielectric layers, and the quantity of layers of seal rings is less than the total quantity of layers of metallization patterns. In this embodiment, the ratio of the quantity of layers of seal rings to the quantity of dielectric layers in the scribe line region 110S is 1. Other ratios (specifically, any ratio greater than or equal to 1) may be utilized, and more or fewer dielectric layers and metallization patterns may be formed in the redistribution structure 140 by repeating or omitting the subsequently described steps. In another embodiment (subsequently described for FIG. 22), the redistribution structure 140 includes five dielectric layers and four layers of metallization patterns, of which one lower dielectric layer remains in the scribe line region 110S and three layers of metallization patterns include seal rings. Thus, the ratio of the quantity of layers of seal rings to the quantity of dielectric layers in the scribe line region 110S is 3. More generally, the quantity of dielectric layers in the scribe line region 110S may be in the range of 1 to ($N_d$−1), where Na is the total quantity of dielectric layers, and the quantity of layers of seal rings may be less than or equal to ($N_m$−1), where $N_m$ is the total quantity of layers of metallization patterns.

Figure 17:
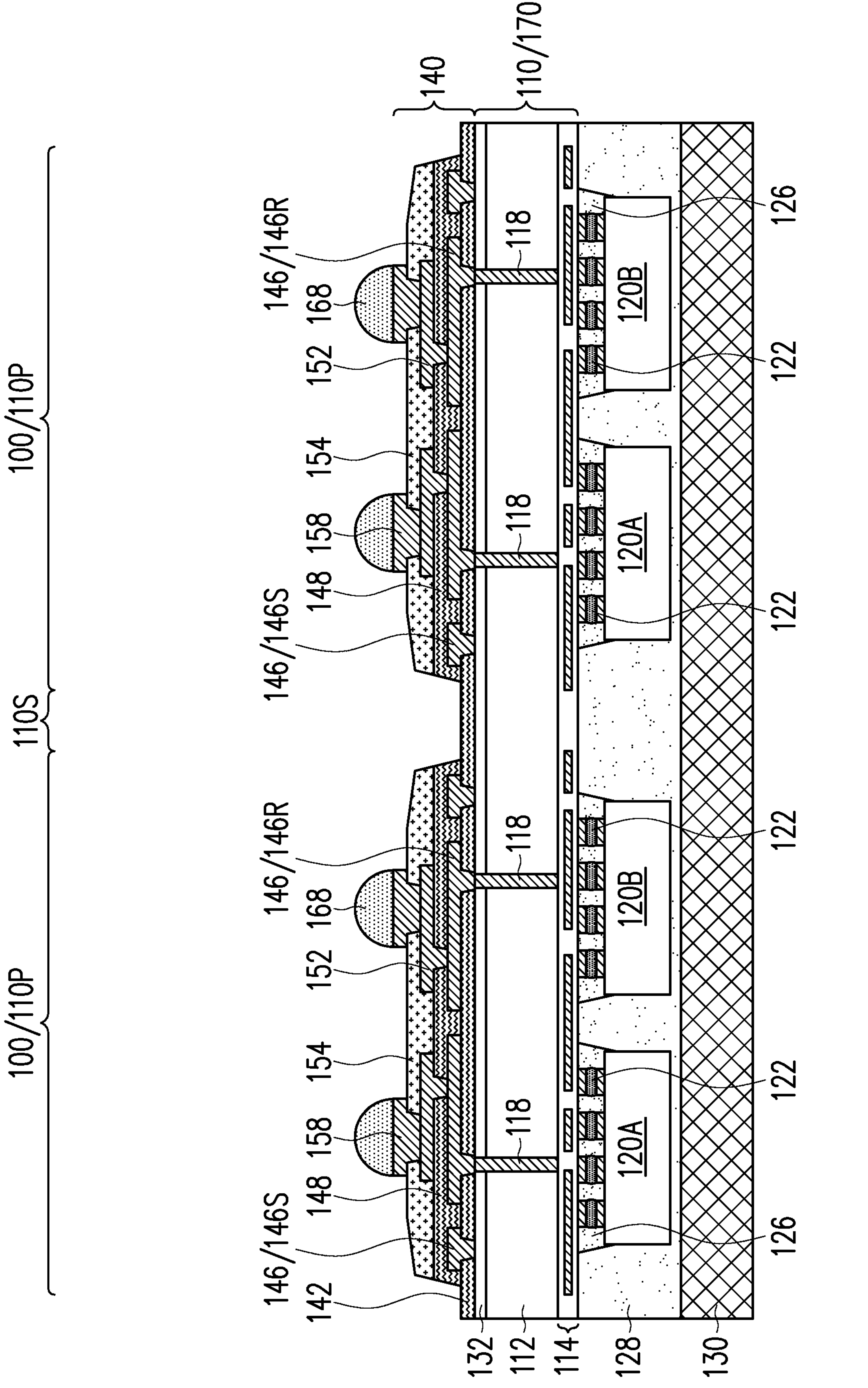

In FIG. 17, conductive connectors 168 are formed on the UBMs 158. The conductive connectors 168 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 168 may include a conductive material such as solder, copper, aluminum, gold, nickel, silver, palladium, tin, the like, or a combination thereof. In some embodiments, the conductive connectors 168 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 168 include metal pillars (such as a copper pillar) formed by sputtering, printing, electro plating, electroless plating, CVD, or the like. The metal pillars may be solder free and have substantially vertical sidewalls.

Figure 18:
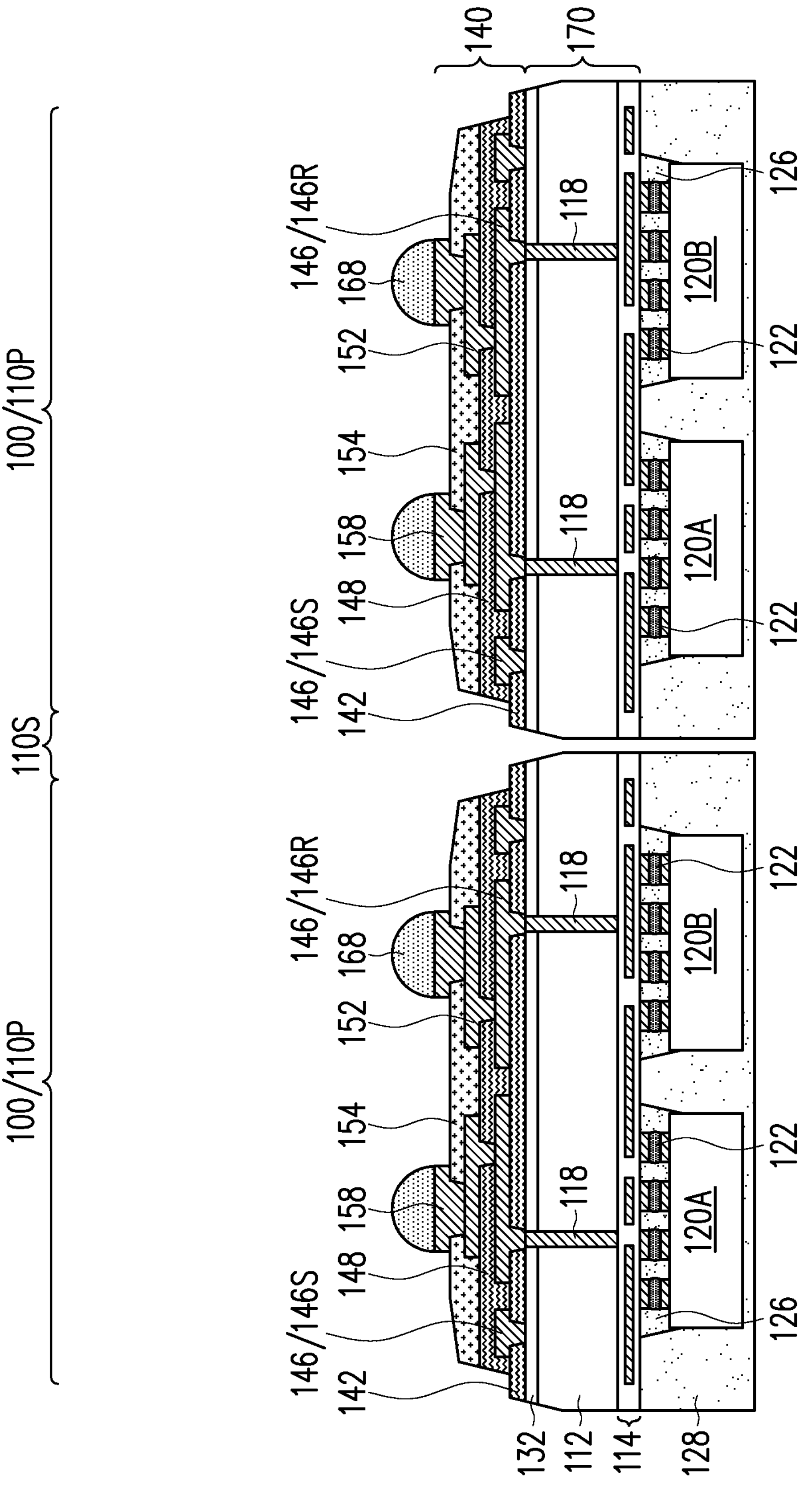
Figure 19:
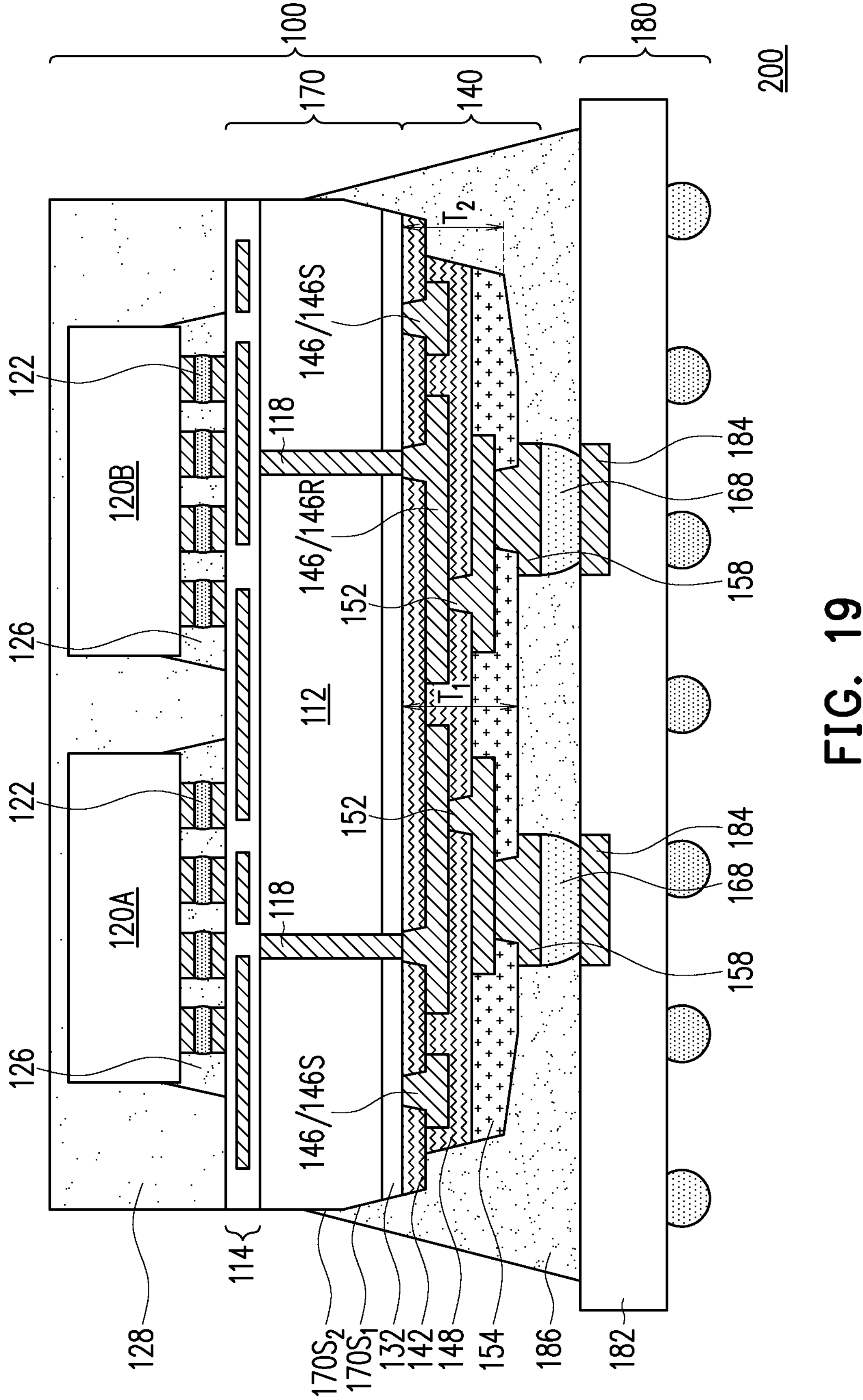

In FIG. 18, a carrier removal is performed to remove the carrier substrate 130 from the integrated circuit devices 120 and/or the encapsulant 128. In embodiments where the carrier substrate 130 is attached to the integrated circuit devices 120 and/or the encapsulant 128 by a bonding layer such as an oxide layer or an adhesive, the removal process may include a grinding process applied to the carrier substrate 130 and the bonding layer. The structure is then flipped over and placed on a tape (not separately illustrated). The tape may be supported by a suitable frame.

Further, a singulation process is performed by cutting along the scribe line region 110S, e.g., around the package regions 110P. The singulation process may include sawing, dicing, or the like. The singulation process singulates the package regions 110P. The resulting, singulated package components 100 are from the package regions 110P. The singulation process forms interposers 170 from the singulated portions of the wafer 110. As a result of the singulation process, the outer sidewalls of each interposer 170 and the corresponding encapsulant 128 are laterally coterminous (within process variations).

In some embodiments, the singulation process includes sawing the redistribution structure 140 (specifically, the dielectric layer 142), the wafer 110 (see FIG. 17) (including the insulating layer 132, the interconnect structure 114, and the substrate 112), and the encapsulant 128. A sawing process can be performed by applying a rotating dicing blade to the scribe line region 110S. The sawing process may be a multi-step sawing process that includes a pre-sawing step, in which a notch is formed in the wafer 110 and the dielectric layer 142, and a main sawing step, in which an opening is formed in the encapsulant 128 and the remaining portion of the wafer 110. The main sawing step may be a more aggressive process than the pre-sawing step, e.g., can have a faster removal rate than the pre-sawing step. The dielectric layer 142 is cut by the sawing process, however, as a result of the dielectric layers 148, 154 being removed from the scribe line region 110S, no cutting the dielectric layers 148, 154 occurs during the sawing process. The quantity of dielectric layers cut by the sawing process is thus reduced, which may increase the sawing depth and/or reduce lateral stress during sawing. Reducing stress during sawing may reduce the risk of delamination.

In FIG. 19, a package component 100 is attached to a package substrate 180. The package substrate 180 includes a substrate core 182, which may be formed of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, or the like, may also be used. Additionally, the substrate core 182 may be a SOI substrate. Generally, an SOI substrate includes a layer of a semiconductor material such as epitaxial silicon, germanium, silicon germanium, SOI, or combinations thereof. The substrate core 182 is, in one alternative embodiment, an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate core 182.

The substrate core 182 may include active and passive devices (not separately illustrated). Devices such as transistors, capacitors, resistors, combinations thereof, and the like may be used to generate the structural and functional requirements of the design for the system. The devices may be formed using any suitable methods.

The substrate core 182 may also include metallization layers and vias (not separately illustrated) and bond pads 184 over the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper), with vias interconnecting the layers of conductive material, and may be formed through any suitable process (such as deposition, damascene, dual damascene, or the like). In some embodiments, the substrate core 182 is substantially free of active and passive devices.

Attaching the package component 100 to the package substrate 180 may include placing the package component 100 on the package substrate 180 and reflowing the conductive connectors 168. The conductive connectors 168 are reflowed to attach the UBMs 158 to the bond pads 184. The conductive connectors 168 connect the package component 100, including metallization layers of the redistribution structure 140, to the package substrate 180, including metallization layers in the substrate core 182. Thus, the package substrate 180 is electrically connected to the integrated circuit devices 120. In some embodiments, passive devices (e.g., surface mount devices (SMDs), not separately illustrated) are attached to the package component 100 (e.g., to the UBMs 158) prior to mounting on the package substrate 180. In such embodiments, the passive devices may be attached to a same surface of the package component 100 as the conductive connectors 168. In some embodiments, passive devices are attached to the package substrate 180, such as to the same surface of the package substrate 180 as the conductive connectors 168.

In some embodiments, an underfill 186 is formed between the package component 100 and the package substrate 180, surrounding the conductive connectors 168 and the UBMs 158. The underfill 186 may be formed by a capillary flow process after the package component 100 is attached or may be formed by a suitable deposition method before the package component 100 is attached. The underfill 186 may be a continuous material extending from the package substrate 180 to the redistribution structure 140.

In this embodiment, the dielectric layers 154 extend along the top surfaces of the dielectric layers 148 without contacting the sidewalls of the dielectric layers 148. Thus, dielectric layers 154 are removed from the sidewalls of the dielectric layers 148 during their patterning. As a result, the entireties of the sidewalls of the dielectric layer 148 are contacted by the underfill 186 and no portions of the sidewalls of the dielectric layer 148 are contacted by the dielectric layer 154. In other embodiments (subsequently described for FIGS. 20-21), the dielectric layers 154 extend along and contact the sidewalls of the dielectric layers 148. Thus, dielectric layers 154 remain on the sidewalls of the dielectric layers 148 after their patterning.

When a multi-step sawing process is used to singulate the package regions 110P, the sidewalls of the interposers 170 (e.g., the sidewalls of the substrates 112) each have several portions as a result of forming a notch in the wafer 110. Specifically, a sidewall of an interposer 170 has a first portion 170$S_1$ and a second portion 170$S_2$. The first portion 170$S_1$ extends between the second portion 170$S_2$ and the back side of the interposer 170 (e.g., a surface of the insulating layer 132). The first portion 170$S_1$ of the sidewall is slanted and the second portion 170$S_2$ of the sidewall is straight. The first portion 170$S_1$ forms an obtuse angle with the second portion 170$S_2$, and also form an obtuse angle with the back side of the interposer 170. The second portion 170$S_2$ is perpendicular to a plane that is parallel with the back side of the interposer 170. Additionally, the sidewalls of the insulating layer 132 are also slanted, and each sidewall of the insulating layer 132 is disposed in the same plane as the first portion 170$S_1$ of the correspond sidewall of the interposer 170. Further yet, the sidewalls of the dielectric layer 142 are also slanted, and each sidewall of the dielectric layer 142 is disposed in the same plane as the first portion 170$S_1$ of the correspond sidewall of the interposer 170. Depending on the process used to form/etch the dielectric layers 148, 154, they may also have sidewalls that are slanted, but each sidewall of the dielectric layers 148, 154 is disposed in a different plane than the corresponding sidewall of the dielectric layer 142. The underfill 186 extends along and contacts the first portion 170$S_1$ and the second portion 170$S_2$ of each sidewall.

As a result of keeping the dielectric layer 142 in the scribe line region 110S (see FIG. 18) during deposition of the dielectric layers 148, 154, the step coverage of the dielectric layers 148, 154 may be increased. Because the dielectric layer 142 is a continuous, planar film on which the dielectric layers 148, 154 are deposited, the step coverage of the dielectric layers 148, 154 is not influenced by the thickness of the dielectric layer 142. The dielectric layers 142, 148, 154 have a first combined thickness $T_1$ in the center of the redistribution structure 140 and have a second combined thickness $T_2$ at the edge of the redistribution structure 140, where the second combined thickness $T_2$ is less than the first combined thickness $T_1$. In some embodiments, each of the dielectric layers 142, 148, 154 have a thickness in the range of 5 μm to 10 μm. In some embodiments, first combined thickness $T_1$ is in the range of 15 μm to 40 μm (such as about 30 μm) while the second combined thickness $T_2$ is in the range of 13 μm to 40 μm (such as about 20 μm). The first combined thickness $T_1$ may be measured at the center of the redistribution structure 140 and the second combined thickness $T_2$ may be measured within 150 μm of the outer sidewalls of the redistribution structure 140. The thickness uniformity of the dielectric layers 142, 148, 154 is the ratio of the first combined thickness $T_1$ to the second combined thickness $T_2$. Increasing the step coverage of the dielectric layers 148, 154 may increase the thickness uniformity of the dielectric layers 142, 148, 154. In some embodiments, the thickness uniformity of the dielectric layers 142, 148, 154 is at least 85%, such as in the range of 85% to 100%. The reliability of the integrated circuit package 200 may thus be increased.

As a result of removing the dielectric layers 148, 154 from the scribe line region 110S (see FIG. 18) before singulation, the width of the dielectric layer 142 is greater than the widths of the dielectric layers 148, 154 such that the sidewalls of the dielectric layer 142 extend beyond the sidewalls of the dielectric layer 148 and/or the dielectric layer 154. The dielectric layer 142 has a first width that is measured between the sidewalls of the dielectric layer 142 in the illustrated cross-sectional view, while the dielectric layer 148 and/or the dielectric layer 154 have a second width that is measured between the sidewalls of the dielectric layer 148 and/or the dielectric layer 154 in the illustrated cross-sectional view, where the second width is less than the first width. The top surface of the dielectric layer 142 is exposed (e.g., not covered) by the dielectric layers 148, 154. As a result, the underfill 186 extends along and is in physical contact with both the top surface and the sidewalls of the dielectric layer 142. Specifically, the underfill 186 covers and contacts the portions of the top surface of the dielectric layer 142, where those portions of the top surface extend between the sidewalls of the dielectric layer 142 and the sidewalls of the dielectric layer 148. The dielectric layers 142, 148, 154 thus have a stairstep profile in the cross-sectional view. Forming the dielectric layers 142, 148, 154 with a stairstep profile may reduce stress exerted on the underfill 186 at the edges of the interposer 170. The risk of the underfill 186 cracking may thus be reduced.

Figure 20:
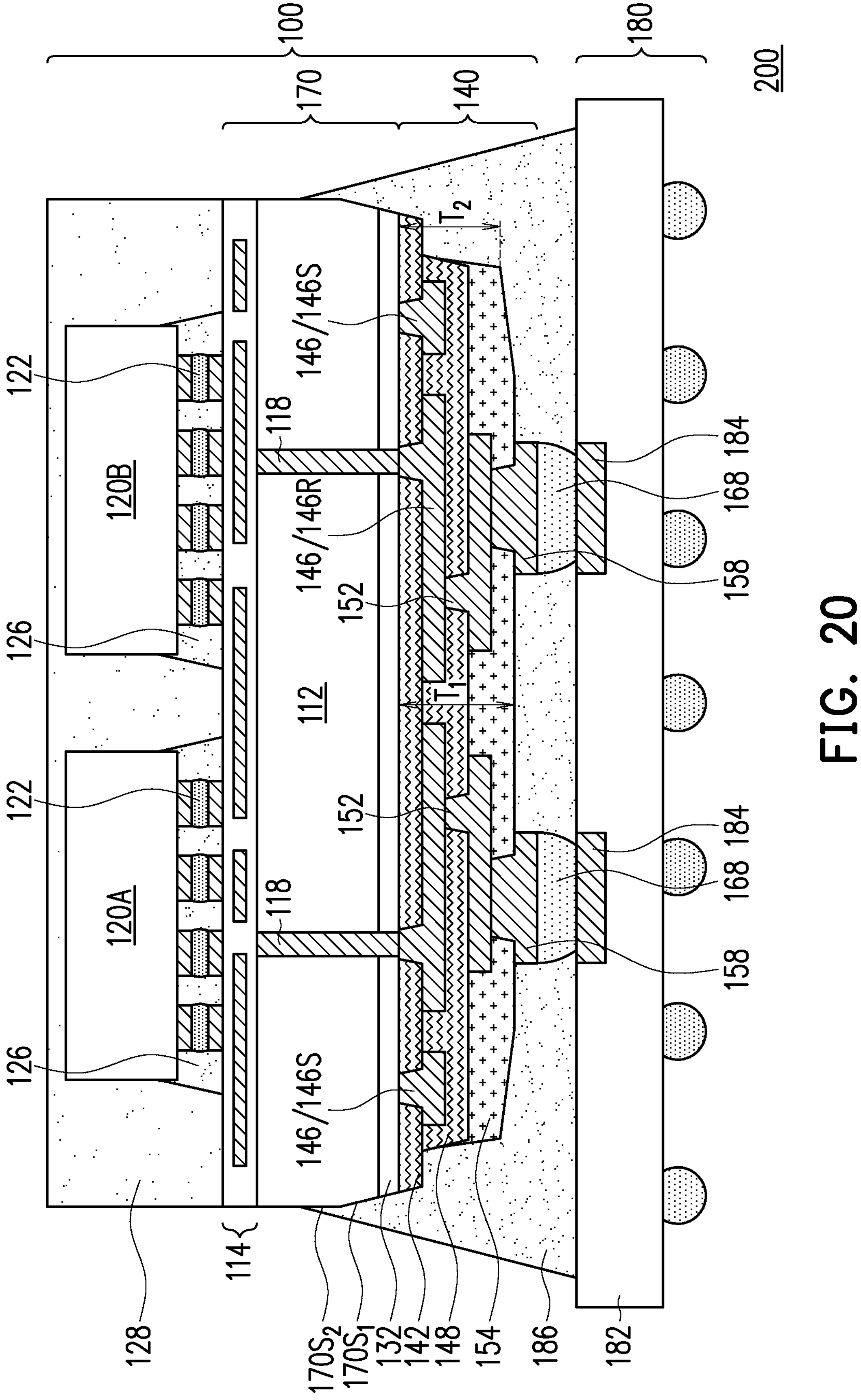
FIG. 20 is a view of an integrated circuit package, in accordance with some other embodiments.

FIG. 20 is a view of an integrated circuit package, in accordance with some other embodiments. This embodiment is similar to the embodiment of FIG. 19, except the dielectric layer 154 extends along portions of the sidewalls of the dielectric layer 148. As a result, some portions of the sidewalls of the dielectric layer 148 are contacted by the dielectric layer 154 and other portions of the sidewalls of the dielectric layer 148 are contacted by the underfill 186. Although not separately illustrated, the sidewalls of the dielectric layer 154 may be curved where they cover the sidewalls of the dielectric layer 148.

Figure 21:
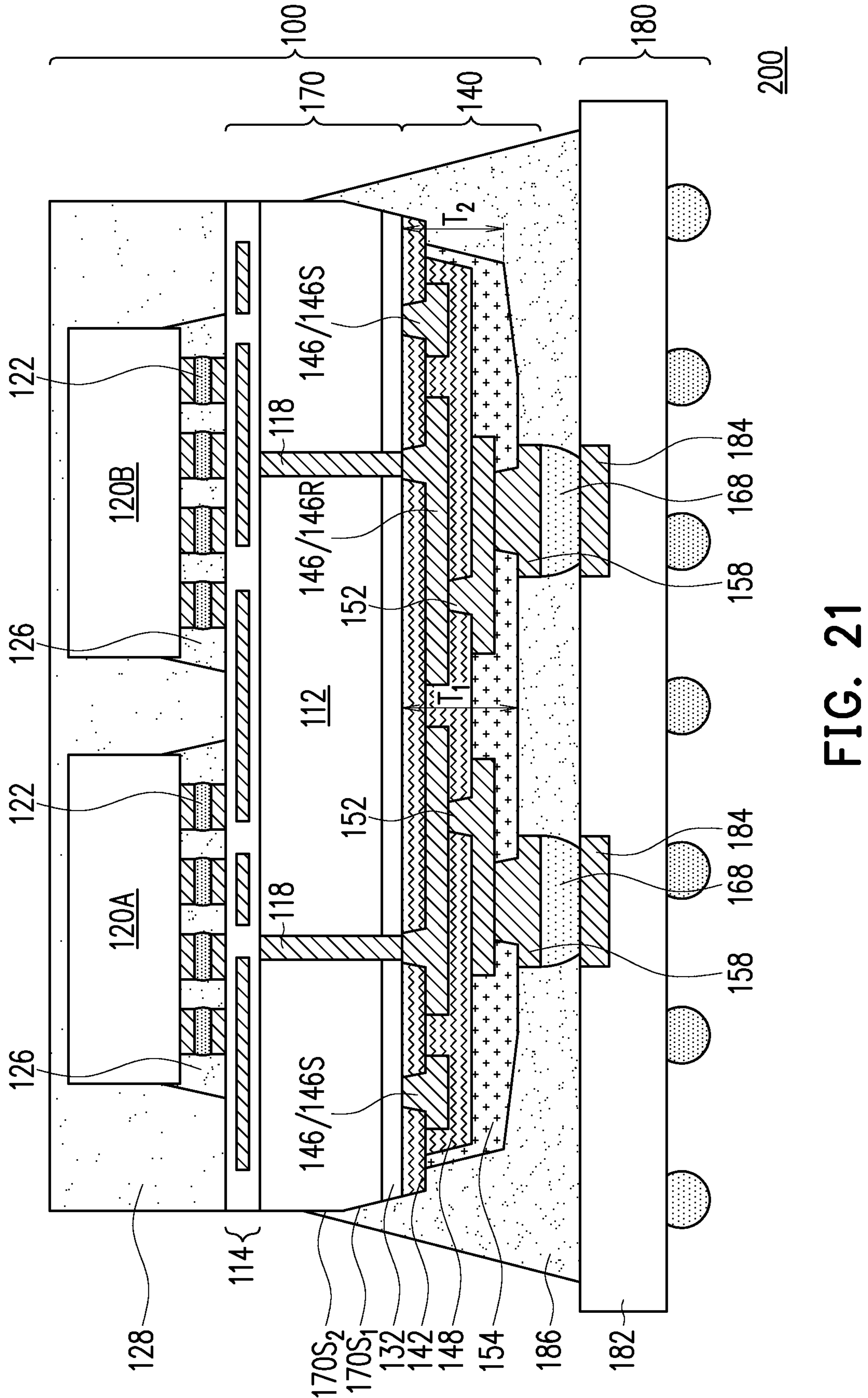
FIG. 21 is a view of an integrated circuit package, in accordance with some other embodiments.

FIG. 21 is a view of an integrated circuit package, in accordance with some other embodiments. This embodiment is similar to the embodiment of FIG. 20, except the dielectric layer 154 extends along entireties of the sidewalls of the dielectric layer 148. As a result, the entireties of the sidewalls of the dielectric layer 148 are contacted by the dielectric layer 154 and no portions of the sidewalls of the dielectric layer 148 are contacted by the underfill 186. Although not separately illustrated, the sidewalls of the dielectric layer 154 may be curved where they cover the sidewalls of the dielectric layer 148.

Embodiments may achieve advantages. Forming the lower dielectric layer 142 in the scribe line region 110S (see FIG. 17) and forming seal rings 146S in only the lower dielectric layer 142 may help reduce delamination during cutting (as compared to forming all of the dielectric layers 142, 148, 154 in the scribe line region 110S) while increasing the step coverage of the upper dielectric layers 148, 154 (as compared to forming none of the dielectric layers in the scribe line region 110S). Increasing the step coverage of the upper dielectric layers 148, 154 may increase the thickness uniformity of the dielectric layers 142, 148, 154. Additionally, the dielectric layers 142, 148, 154 have a stairstep profile, which may reduce the risk of the underfill 186 cracking. The reliability of the integrated circuit package 200 may thus be increased.

Figure 22:
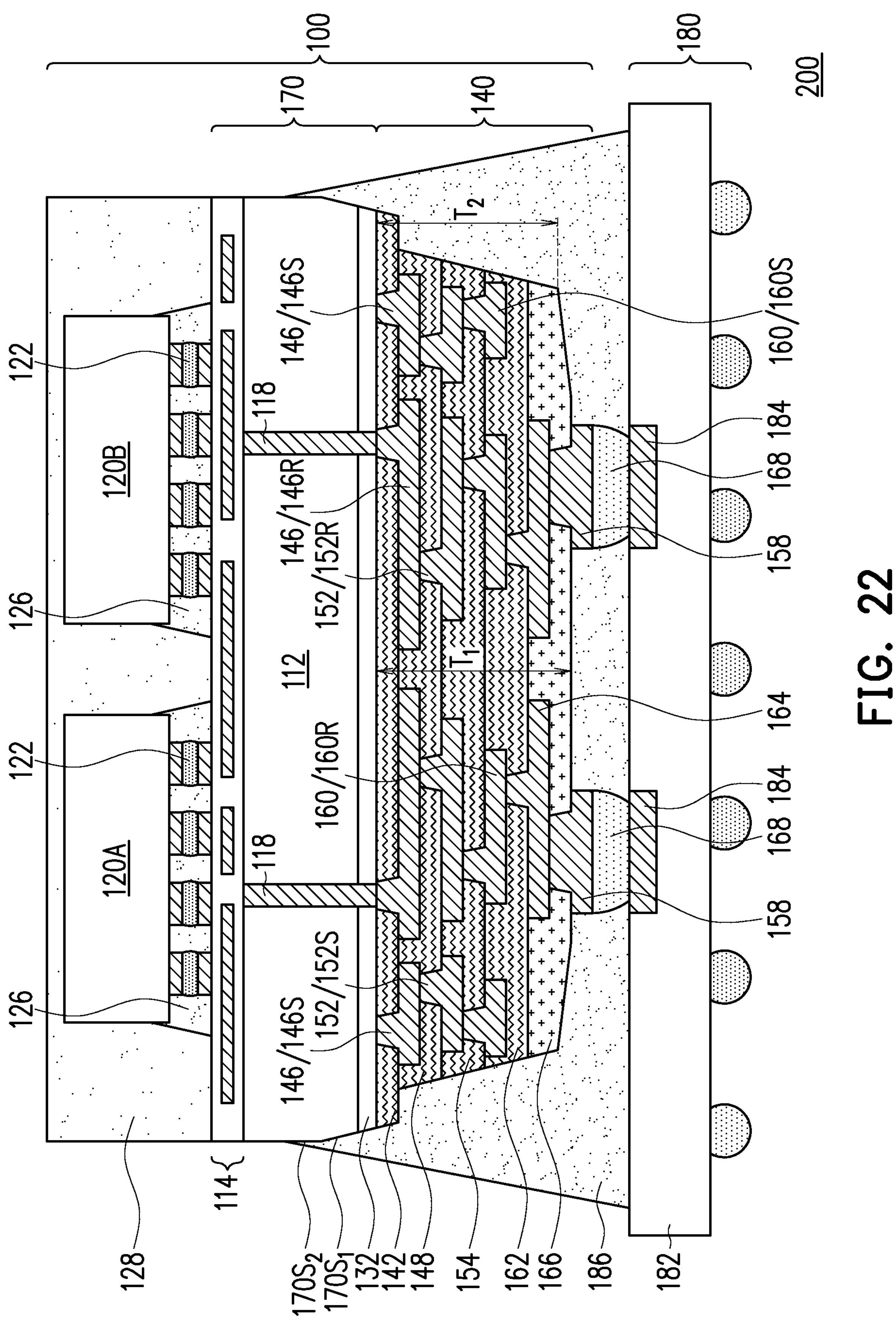
FIG. 22 is a view of an integrated circuit package, in accordance with some other embodiments.

FIG. 22 is a view of an integrated circuit package, in accordance with some other embodiments. This embodiment is similar to the embodiment of FIG. 19, except the redistribution structure 140 further includes metallization patterns 160, 164 and dielectric layers 162, 166. The metallization pattern 160 extends along and through the dielectric layer 154. The dielectric layer 162 is disposed on the metallization pattern 160 and the dielectric layer 154. The dielectric layer 162 may be patterned in a similar manner as the dielectric layer 154. The metallization pattern 164 extends along and through the dielectric layer 162. The dielectric layer 166 is disposed on the metallization pattern 164 and the dielectric layer 162. The dielectric layer 166 may be patterned in a similar manner as the dielectric layer 154.

In this embodiment, the metallization pattern 152 includes redistribution lines 152R (which are electrically functional portions of the metallization pattern 152) and a seal ring 152S (which are dummy portions of the metallization pattern 152). The seal ring 152S is stacked on and in contact with the seal ring 146S. The redistribution lines 152R contact the redistribution lines 146R. Similarly, the metallization pattern 160 includes redistribution lines 160R (which are electrically functional portions of the metallization pattern 160) and a seal ring 160S (which are dummy portions of the metallization pattern 160). The seal ring 160S is stacked on and in contact with the seal ring 152S. The redistribution lines 160R contact the redistribution lines 152R. In this embodiment, the ratio of the quantity of layers of seal rings to the quantity of dielectric layers in the scribe line region 110S (see FIG. 17) is 3.

In an embodiment, a device includes: an interposer including through-substrate vias; a redistribution structure including: a first dielectric layer over the interposer, the first dielectric layer having a first width between first sidewalls of the first dielectric layer in a cross-sectional view; a first metallization pattern extending along and through the first dielectric layer, the first metallization pattern including redistribution lines and a seal ring, the redistribution lines contacting the through-substrate vias, the seal ring extending around the redistribution lines in a top-down view, the seal ring being electrically isolated from the redistribution lines; and a second dielectric layer over the first metallization pattern and the first dielectric layer, the second dielectric layer covering a top surface of the seal ring, the second dielectric layer having a second width between second sidewalls of the second dielectric layer in the cross-sectional view, the second width being less than the first width. In some embodiments, the device further includes: a package substrate connected to the redistribution structure; and an underfill between the package substrate and the redistribution structure, the underfill contacting portions of a top surface of the first dielectric layer, the portions of the top surface extending between the first sidewalls of the first dielectric layer and the second sidewalls of the second dielectric layer. In some embodiments of the device, the first sidewalls of the first dielectric layer and the second sidewalls of the second dielectric layer are slanted sidewalls. In some embodiments of the device, third sidewalls of the interposer have first portions and second portions, the first portions forming obtuse angles with the second portions, the first portions extending between the second portions and a back side of the interposer, the first sidewalls of the first dielectric layer being disposed in the same planes as the first portions of the third sidewalls of the interposer. In some embodiments, the device further includes: an integrated circuit device attached to a front side of the interposer; and an encapsulant around the integrated circuit device. In some embodiments of the device, the redistribution structure further includes: a second metallization pattern extending along and through the second dielectric layer; and a third dielectric layer over the second metallization pattern and the second dielectric layer, the third dielectric layer contacting no portions of the second sidewalls of the second dielectric layer. In some embodiments of the device, the redistribution structure further includes: a second metallization pattern extending along and through the second dielectric layer; and a third dielectric layer over the second metallization pattern and the second dielectric layer, the third dielectric layer contacting portions of the second sidewalls of the second dielectric layer. In some embodiments of the device, the redistribution structure further includes: a second metallization pattern extending along and through the second dielectric layer; and a third dielectric layer over the second metallization pattern and the second dielectric layer, the third dielectric layer contacting entireties of the second sidewalls of the second dielectric layer. In some embodiments of the device, the redistribution structure further includes: a second metallization pattern extending along and through the second dielectric layer; and a third dielectric layer over the second metallization pattern and the second dielectric layer, where the first dielectric layer, the second dielectric layer, and the third dielectric layer have a first combined thickness in a center of the redistribution structure, where the first dielectric layer, the second dielectric layer, and the third dielectric layer have a second combined thickness at an edge of the redistribution structure, and where the second combined thickness is less than the first combined thickness. In some embodiments of the device, a ratio of the first combined thickness to the second combined thickness is at least 85%.

In an embodiment, a method includes: depositing a first dielectric layer over a wafer, the first dielectric layer overlapping a package region and a scribe line region of the wafer; forming a first metallization pattern extending along and through the first dielectric layer; depositing a second dielectric layer over the first metallization pattern and the first dielectric layer, the second dielectric layer overlapping the package region and the scribe line region; removing the second dielectric layer from the scribe line region, the second dielectric layer remaining in the package region; after removing the second dielectric layer from the scribe line region, forming a second metallization pattern extending along and through the second dielectric layer; and sawing the wafer and the first dielectric layer in the scribe line region. In some embodiments of the method, removing the second dielectric layer from the scribe line region includes: patterning the second dielectric layer to form openings and to remove the second dielectric layer from the scribe line region, the second metallization pattern being formed in the openings of the second dielectric layer. In some embodiments of the method, the second dielectric layer is formed of a photosensitive material, and patterning the second dielectric layer includes exposing the photosensitive material to light. In some embodiments of the method, sawing the wafer and the first dielectric layer includes: forming a notch in the scribe line region of the wafer with a pre-sawing step; and forming an opening in the scribe line region of the wafer with a main sawing step. In some embodiments, the method further includes: depositing a third dielectric layer over the second metallization pattern and the second dielectric layer, the third dielectric layer overlapping the package region and the scribe line region; and removing the third dielectric layer from the scribe line region and from a sidewall of the second dielectric layer. In some embodiments, the method further includes: depositing a third dielectric layer over the second metallization pattern and the second dielectric layer, the third dielectric layer overlapping the package region and the scribe line region; and removing the third dielectric layer from the scribe line region, the third dielectric layer remaining on a sidewall of the second dielectric layer.

In an embodiment, a method includes: forming a redistribution structure over an interposer, the interposer including through-substrate vias, the redistribution structure including: a first dielectric layer; a first metallization pattern extending along and through the first dielectric layer, the first metallization pattern including redistribution lines and a seal ring, the redistribution lines contacting the through-substrate vias, the seal ring extending around the redistribution lines in a top-down view, the seal ring being electrically isolated from the redistribution lines; and a second dielectric layer over the first metallization pattern and the first dielectric layer, the second dielectric layer covering the seal ring and a first portion of the first dielectric layer, a second portion of the first dielectric layer being uncovered by the second dielectric layer; and singulating the redistribution structure and the interposer by sawing the interposer and the second portion of the first dielectric layer. In some embodiments, the method further includes: attaching an integrated circuit device to a front side of the interposer, the redistribution structure being formed over a back side of the interposer; and forming an encapsulant around the integrated circuit device, the encapsulant being singulated by the sawing. In some embodiments, the method further includes: connecting a package substrate to the redistribution structure; and forming an underfill between the package substrate and the redistribution structure, the underfill covering the second portion of the first dielectric layer. In some embodiments of the method, sawing the interposer includes sawing a notch in the interposer such that a sidewall of the interposer has a first portion and a second portion, the first portion of the sidewall forming an obtuse angle with the second portion of the sidewall, the first portion of the sidewall extending between the second portion of the sidewall and a back side of the interposer, the underfill contacting the first portion and the second portion of the sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

depositing a first dielectric layer over a wafer, the first dielectric layer overlapping a package region and a scribe line region of the wafer;

forming a first metallization pattern extending along and through the first dielectric layer;

depositing a second dielectric layer over the first metallization pattern and the first dielectric layer, the second dielectric layer overlapping the package region and the scribe line region;

removing the second dielectric layer from the scribe line region, the second dielectric layer remaining in the package region;

after removing the second dielectric layer from the scribe line region, forming a second metallization pattern extending along and through the second dielectric layer; and sawing the wafer and the first dielectric layer in the scribe line region.

2. The method of claim 1, wherein removing the second dielectric layer from the scribe line region comprises:

patterning the second dielectric layer to form openings and to remove the second dielectric layer from the scribe line region, the second metallization pattern being formed in the openings of the second dielectric layer.

3. The method of claim 2, wherein the second dielectric layer is formed of a photosensitive material, and patterning the second dielectric layer comprises exposing the photosensitive material to light.

4. The method of claim 1, wherein sawing the wafer and the first dielectric layer comprises:

forming a notch in the scribe line region of the wafer with a pre-sawing step; and forming an opening in the scribe line region of the wafer with a main sawing step.

5. The method of claim 1, further comprising:

depositing a third dielectric layer over the second metallization pattern and the second dielectric layer, the third dielectric layer overlapping the package region and the scribe line region; and removing the third dielectric layer from the scribe line region and from a sidewall of the second dielectric layer.

6. The method of claim 1, further comprising:

depositing a third dielectric layer over the second metallization pattern and the second dielectric layer, the third dielectric layer overlapping the package region and the scribe line region; and removing the third dielectric layer from the scribe line region, the third dielectric layer remaining on a sidewall of the second dielectric layer.

7. A method comprising:

forming a redistribution structure over an interposer, the interposer comprising through-substrate vias, the redistribution structure comprising:

a first dielectric layer;

a first metallization pattern extending along and through the first dielectric layer, the first metallization pattern comprising redistribution lines and a seal ring, the redistribution lines contacting the through-substrate vias, the seal ring extending around the redistribution lines in a top-down view, the seal ring being electrically isolated from the redistribution lines; and a second dielectric layer over the first metallization pattern and the first dielectric layer, the second dielectric layer covering the seal ring and a first portion of the first dielectric layer, a second portion of the first dielectric layer being uncovered by the second dielectric layer; and singulating the redistribution structure and the interposer by sawing the interposer and the second portion of the first dielectric layer.

8. The method of claim 7, further comprising:

attaching an integrated circuit device to a front side of the interposer, the redistribution structure being formed over a back side of the interposer; and forming an encapsulant around the integrated circuit device, the encapsulant being singulated by the sawing.

9. The method of claim 7, further comprising:

connecting a package substrate to the redistribution structure; and forming an underfill between the package substrate and the redistribution structure, the underfill covering the second portion of the first dielectric layer.

10. The method of claim 9, wherein sawing the interposer comprises sawing a notch in the interposer such that a sidewall of the interposer has a first portion and a second portion, the first portion of the sidewall forming an obtuse angle with the second portion of the sidewall, the first portion of the sidewall extending between the second portion of the sidewall and a back side of the interposer, the underfill contacting the first portion and the second portion of the sidewall.

11. The method of claim 7, wherein sawing the interposer and the second portion of the first dielectric layer comprises sawing through the first dielectric layer without sawing through the second dielectric layer.

12. The method of claim 7, wherein the seal ring contacts a surface of the interposer and does not contact any of the through-substrate vias.

13. The method of claim 7, wherein after the singulating, the seal ring is disposed between the redistribution lines and a sidewall of the first dielectric layer.

14. The method of claim 7, wherein the redistribution structure further comprises a second metallization pattern extending along and through the second dielectric layer, the second metallization pattern contacting the redistribution lines through the second dielectric layer, the seal ring remaining covered by the second dielectric layer and not contacted by the second metallization pattern.

15. A method comprising:

attaching a first integrated circuit device and a second integrated circuit device to a front side of a wafer, wherein the wafer has a first package region, a second package region, and a scribe line region between the first package region and the second package region, wherein the first integrated circuit device is attached in the first package region, and the second integrated circuit device is attached in the second package region;

forming a redistribution structure by:

depositing a first dielectric layer on a back side of the wafer, the first dielectric layer overlapping the first package region, the second package region, and the scribe line region;

forming a first metallization pattern extending along and through the first dielectric layer;

depositing a second dielectric layer on the first metallization pattern and the first dielectric layer, the second dielectric layer overlapping the first package region, the second package region, and the scribe line region;

removing the second dielectric layer from the scribe line region while the second dielectric layer remains in the first package region and the second package region; and after removing the second dielectric layer from the scribe line region, forming a second metallization pattern extending along and through the second dielectric layer; and sawing the wafer and the redistribution structure in the scribe line region.

16. The method of claim 15, wherein the first dielectric layer remains in the scribe line region, and sawing the redistribution structure in the scribe line region comprises sawing through the first dielectric layer without sawing through the second dielectric layer.

17. The method of claim 15, wherein after the sawing, the first dielectric layer has a first width between sidewalls of the first dielectric layer in a cross-sectional view and the second dielectric layer has a second width between sidewalls of the second dielectric layer in the cross-sectional view, the second width being less than the first width.

18. The method of claim 15, wherein the first metallization pattern comprises redistribution lines and a seal ring, the seal ring extending around the redistribution lines in a top-down view, the seal ring being electrically isolated from the redistribution lines, wherein the second dielectric layer covers a top surface of the seal ring, and the second metallization pattern contacts the redistribution lines without contacting the seal ring.

19. The method of claim 18, wherein the seal ring contacts the back side of the wafer without contacting through-substrate vias of the wafer.

20. The method of claim 15, wherein removing the second dielectric layer from the scribe line region comprises patterning the second dielectric layer to form openings in the second dielectric layer and to remove the second dielectric layer from the scribe line region, and the second metallization pattern is formed in the openings of the second dielectric layer.

* * * * *